(12) United States Patent
Lee et al.

(10) Patent No.: US 11,545,648 B2
(45) Date of Patent: Jan. 3, 2023

(54) LIGHT EMITTING DISPLAY DEVICE AND METHOD OF FABRICATING THE SAME

(71) Applicant: LG Display Co., LTD., Seoul (KR)

(72) Inventors: SoJung Lee, Goyang-si (KR);
JongSung Kim, Paju-si (KR);
Seungkyeom Kim, Paju-si (KR);
Sumin Lee, Susan (KR)

(73) Assignee: LG DISPLAY CO., LTD., Seoul (KR)

( * ) Notice: Subject to any disclaimer, the term of this patent is extended or adjusted under 35 U.S.C. 154(b) by 152 days.

(21) Appl. No.: 16/995,305

(22) Filed: Aug. 17, 2020

(65) Prior Publication Data
US 2021/0119183 A1    Apr. 22, 2021

(30) Foreign Application Priority Data
Oct. 17, 2019    (KR) .......................... 10-2019-0128964

(51) Int. Cl.
*H01L 51/52*    (2006.01)
*H01L 27/32*    (2006.01)

(52) U.S. Cl.
CPC ...... *H01L 51/5271* (2013.01); *H01L 27/3246* (2013.01); *H01L 51/5218* (2013.01); *H01L 27/323* (2013.01); *H01L 2227/323* (2013.01); *H01L 2251/5315* (2013.01)

(58) Field of Classification Search
CPC ............... H01L 27/3246; H01L 27/323; H01L 2251/5315
See application file for complete search history.

(56) References Cited

U.S. PATENT DOCUMENTS

| 2013/0032803 A1 | 2/2013 | Moon et al. |
| 2014/0353631 A1 | 12/2014 | Park et al. |
| 2018/0122876 A1* | 5/2018 | Shim .................. H01L 51/5203 |
| 2019/0181199 A1* | 6/2019 | Choi .................. H01L 27/3258 |

FOREIGN PATENT DOCUMENTS

| KR | 10-2013-0015704 A | 2/2013 |
| KR | 10-2014-0140989 A | 12/2014 |

\* cited by examiner

*Primary Examiner* — Fernando L Toledo
*Assistant Examiner* — Valerie N Newton
(74) *Attorney, Agent, or Firm* — Birch, Stewart, Kolasch & Birch, LLP

(57) ABSTRACT

According to an aspect of the present disclosure, a light emitting display device includes a substrate defined by a plurality of sub-pixels and a first overcoating layer disposed on the substrate, a connection electrode and a sacrificial layer disposed on the first overcoating layer, a first electrode disposed on the connection electrode, a second overcoating layer disposed on the sacrificial layer and including an opening that exposes a portion of the first electrode, a dummy first electrode disposed on a top surface of the second overcoating layer and a side surface of the opening and separated from the first electrode, a bank layer covering the dummy first electrode and a portion of the first electrode, and an emission layer and a second electrode disposed on the first electrode and the bank layer.

20 Claims, 21 Drawing Sheets

LIGHT EMITTING DISPLAY DEVICE AND METHOD OF FABRICATING THE SAME

CROSS-REFERENCE TO RELATED APPLICATIONS

This application claims the benefit priority to Korean Patent Application No. 10-2019-0128964 filed on Oct. 17, 2019, in the Korean Intellectual Property Office, the entire contents of which are hereby expressly incorporated herein by reference into the present application.

BACKGROUND

Field

The present disclosure relates to a light emitting display device and more particularly, to a light emitting display device that has enhanced light extraction efficiency through an improved process and a method of fabricating the same.

Description of the Related Art

As the information age advances, the field of display device for visually displaying electrical information signals has grown rapidly. Accordingly, studies on various display devices are ongoing to improve the performance such as thinning, weight lightening, and low power consumption.

Among various display devices, a light emitting display device is a self-light emitting display device and does not need a separate light source unlike a liquid crystal display device. Thus, the light emitting display device can be manufactured into a lightweight and thin form. Further, the organic light emitting display device is advantageous in terms of power consumption since it is driven with a low voltage. Also, the organic light emitting display device has excellent color expression ability, a high response speed, a wide viewing angle, and a high contrast ratio (CR). Therefore, the organic light emitting display device is expected to be applied to various fields.

Meanwhile, light emitted from an emission layer of the light emitting display device is output to the outside of the light emitting display device through various components of the light emitting display device. However, a part of the light emitted from the emission layer may not be output to the outside of the light emitting display device but can be confined in the light emitting display device. This may cause problems with the light extraction efficiency of the light emitting display device.

For example, a part of the light emitted from the emission layer can be confined in the light emitting display device due to a total reflection loss, a waveguide loss, and a surface plasmon loss. Here, the total reflection loss refers to degradation of light extraction efficiency due to light confined in the light emitting display device by a total reflection at the interface between a substrate and air, among the light emitted from the emission layer. The waveguide loss refers to degradation of light extraction efficiency due to the light confined in the light emitting display device by the total reflection at the interface between components in the light emitting display device. The surface plasmon loss can occur when light vibrates free electrons of a metal surface due to a phenomenon that light is absorbed onto the metal surface while being projected and propagated so that the light may not be reflected or transmitted, which would result in degradation of light extraction efficiency.

SUMMARY OF THE INVENTION

An object to be achieved by the present disclosure is to provide an improved light emitting display device in which a side mirror-shaped dummy anode is used to improve a total reflection loss and a waveguide loss and a method of fabricating the same.

Another object to be achieved by the present disclosure is to provide an improved light emitting display device in which an anode has an undercut structure at an edge thereof to be separated from a dummy anode and a method of fabricating the same.

Objects of the present disclosure are not limited to the above-mentioned objects, and other objects, which are not mentioned above, can be clearly understood by those skilled in the art from the following descriptions.

According to an aspect of the present disclosure, a light emitting display device includes a substrate defined by a plurality of sub-pixels and a first overcoating layer disposed on the substrate. The light emitting display device also includes a connection electrode and a sacrificial layer disposed on the first overcoating layer and a first electrode disposed on the connection electrode. The light emitting display device further includes a second overcoating layer disposed on the sacrificial layer and including an opening that exposes a portion of the first electrode. The light emitting display device also includes a dummy first electrode disposed on a top surface of the second overcoating layer and a side surface of the opening and separated from the first electrode. The light emitting display device further includes a bank layer covering the dummy first electrode and a portion of the first electrode, and an emission layer and a second electrode disposed on the first electrode and the bank layer.

According to another aspect of the present disclosure, a method of fabricating a light emitting display device includes preparing a first overcoating layer on a substrate on which a thin film transistor has been provided. The method also includes preparing a connection electrode on the first overcoating layer and preparing an insulating layer on the entire surface of the substrate on which the connection electrode and the first overcoating layer have been provided. The method further includes preparing a second overcoating layer including an opening on the insulating layer. The method also includes making an undercut structure at a bottom portion of a side surface of the second overcoating layer by etching the insulating layer using the second overcoating layer as a mask. The method further includes preparing a first electrode on the connection electrode as well as inside the undercut structure and preparing a dummy first electrode on a top surface and a side surface of the second overcoating layer at the same time. The method also includes preparing a bank layer that covers the dummy first electrode and a portion of the first electrode and preparing an emission layer and a second electrode on the first electrode and the bank layer. The first electrode can be separated from the dummy first electrode by the undercut structure.

Other detailed matters of the exemplary embodiments are included in the detailed description and the drawings.

According to the present disclosure, a side mirror-shaped dummy anode is used. Thus, it is possible to improve the light extraction efficiency of a light emitting display device.

According to the present disclosure, an anode has an undercut structure at an edge thereof to be separated from a dummy anode. Thus, it is possible to suppress contact resistance and leakage issues.

According to the present disclosure, the anode is formed without performing a separate patterning process, which means a photolithographic process can be omitted once. Thus, it is possible to improve processability and reduce manufacturing costs.

According to the present disclosure, a process of forming a hole in a two-layer overcoating layer can be omitted. Thus, it is possible to improve processability and secure a design margin for high resolution.

The effects and advantages of the present disclosure are not limited to the contents exemplified above and below, and other various effects and advantages are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Figure 1:
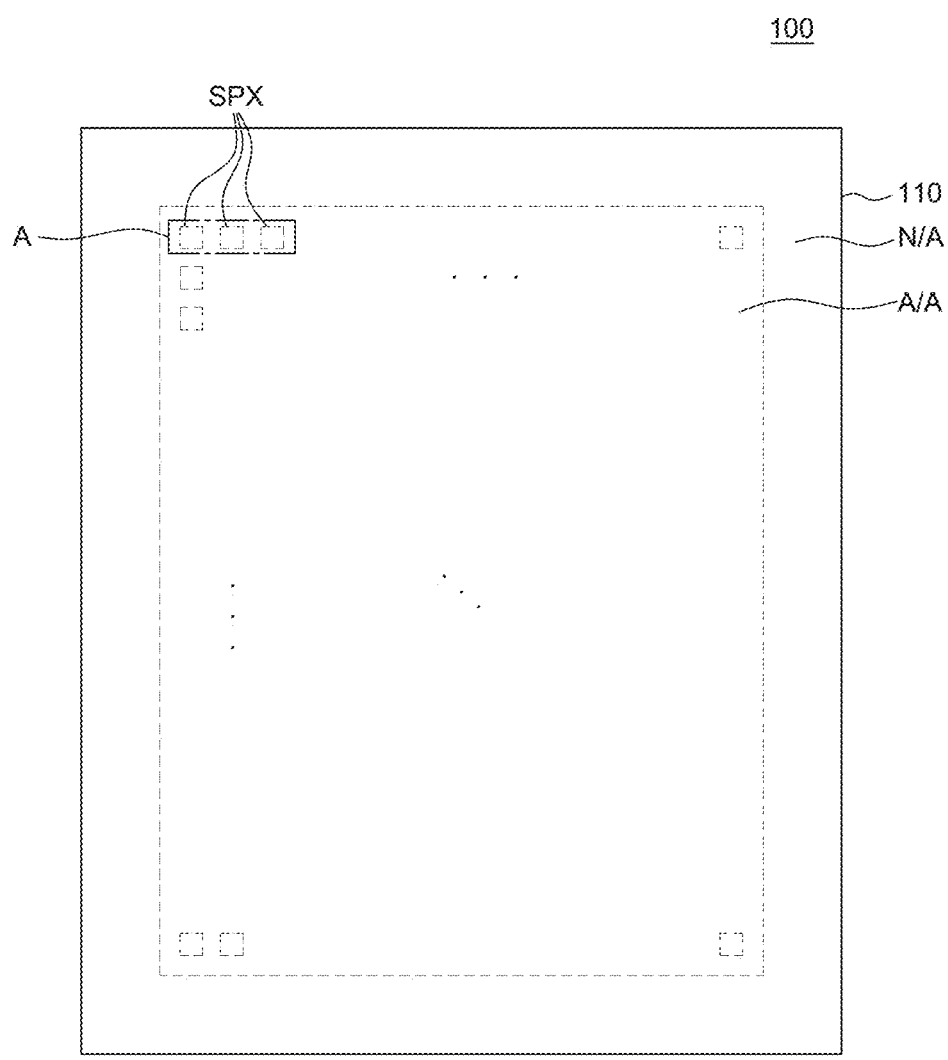
FIG. 1 is a plan view of a light emitting display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies can be omitted to avoid unnecessarily obscuring the subject matter of the present disclosure. The terms such as "including," "having," and "consist of" used herein are generally intended to allow other components to be added unless the terms are used with the term "only". Any references to singular can include plural unless expressly stated otherwise.

Components are interpreted to include an ordinary error range even if not expressly stated.

When the position relation between two parts is described using the terms such as "on", "above", "below", and "next", one or more parts can be positioned between the two parts unless the terms are used with the term "immediately" or "directly".

When an element or layer is disposed "on" another element or layer, another layer or another element can be interposed directly on the other element or therebetween.

Although the terms "first", "second", and the like are used for describing various components, these components are not confined by these terms and do not recite any order. These terms are merely used for distinguishing one component from the other components. Therefore, a first component to be mentioned below can be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a light emitting display device according to exemplary embodiments of the present disclosure will be described in detail with reference to accompanying drawings. All the components of the light emitting display device according to all embodiments of the present disclosure are operatively coupled and configured.

FIG. 1 is a plan view of a light emitting display device according to an exemplary embodiment of the present disclosure.

Figure 2:
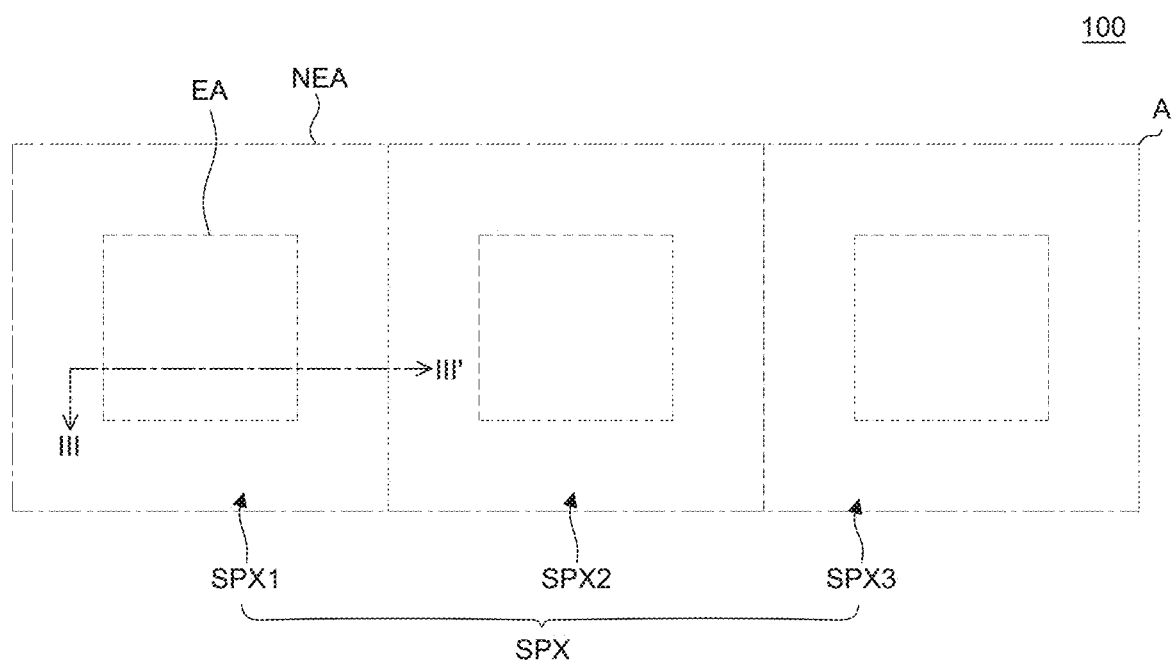
FIG. 2 is a schematic enlarged plan view of an area "A" of FIG. 1.

FIG. 2 is a schematic enlarged plan view of an area "A" of FIG. 1.

Figure 3:
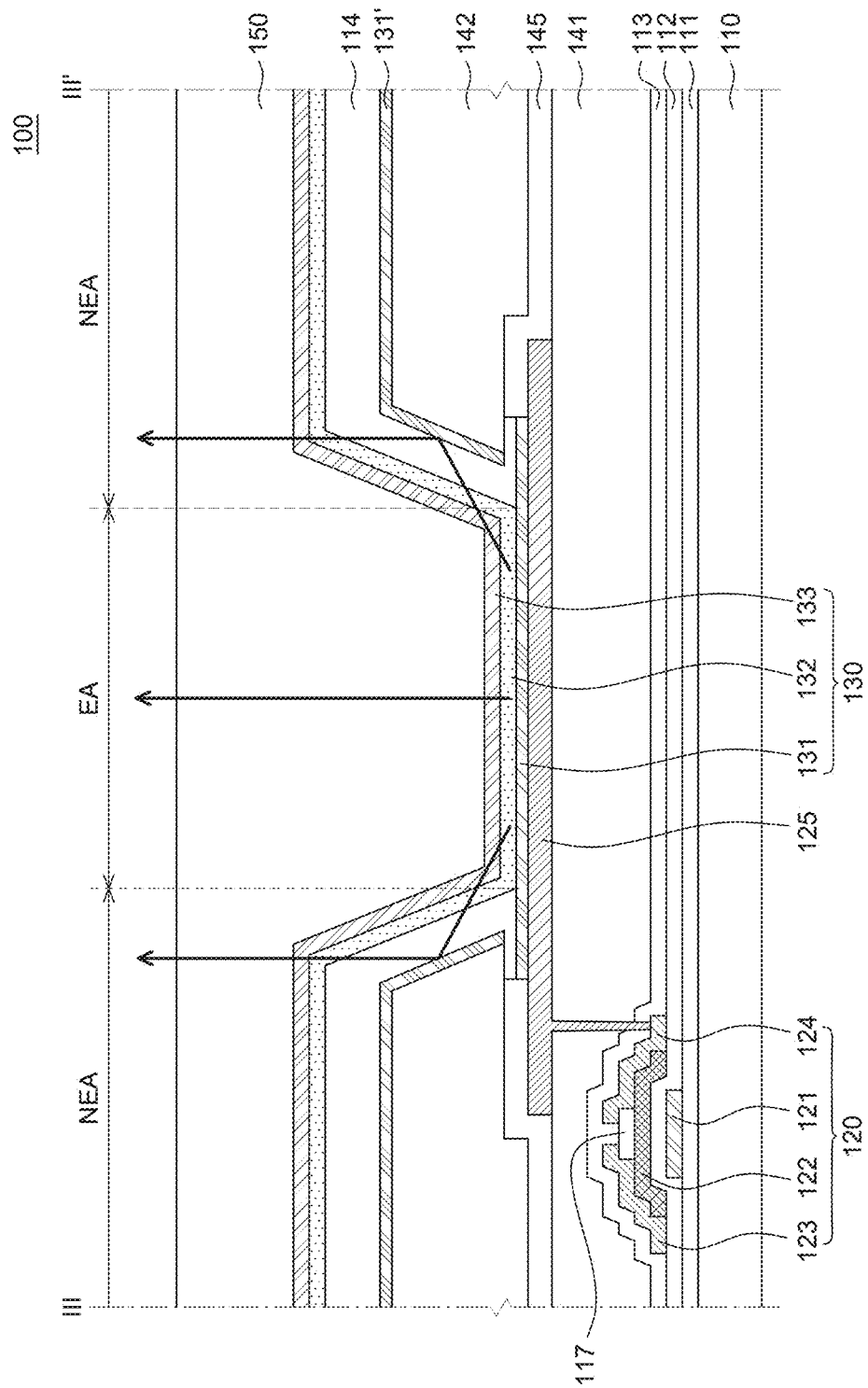
FIG. 3 is a cross-sectional view of the light emitting display device as taken along a line of FIG. 2.

FIG. 3 is a cross-sectional view of the light emitting display device as taken along a line III-III' of FIG. 2.

In this example, FIG. 2 illustrates only three sub-pixels SPX for convenience in explanation, and FIG. 3 is a cross-sectional view of a first sub-pixel among the three sub-pixels SPX. However, obviously the light emitting display device according to the embodiments of the present disclosure includes a plurality of other sub-pixels.

Referring to FIG. 1 through FIG. 3, a light emitting display device 100 according to an exemplary embodiment of the present disclosure can include a substrate 110 and a thin film transistor 120. Also, the light emitting display device 100 includes a light emitting element 130, first and second overcoating layers 141 and 142, a bank layer 114, a sacrificial layer 145 and an encapsulation layer 150.

The light emitting display device 100 can be implemented as a top emission type light emitting display device.

The substrate 110 can include an active area A/A and a non-active area N/A.

The active area A/A is a region of the light emitting display device 100 in which images are displayed.

In the active area A/A, a display element and various driving elements for driving the display element can be disposed. For example, the display element can be configured as the light emitting element 130 including a first electrode 131, an emission layer 132 and a second electrode 133. Further, various driving element s, such as the thin film transistor 120, a capacitor, a wiring line, etc., for driving the display element can be disposed in the active area A/A.

In the active area A/A, a plurality of sub-pixels SPX can be defined.

Each sub-pixel SPX is a minimum unit for displaying an image. Each of the plurality of sub-pixels SPX can include the light emitting element 130 and a driving circuit. Further, the plurality of sub-pixels SPX can emit light with different wavelengths. For example, the plurality of sub-pixels SPX can include a first sub-pixel SPX1 as a red sub-pixel, a second sub-pixel SPX2 as a green sub-pixel, and a third sub-pixel SPX3 as a blue sub-pixel, but is not limited thereto. The plurality of sub-pixels SPX can further include a white sub-pixel.

The driving circuit of each sub-pixel SPX is configured to control driving of the light emitting element 130. For example, the driving circuit can include the thin film transistor 120 and a capacitor, but is not limited thereto.

The non-active area N/A is a region of the light emitting display device 100 in which images are not displayed. In the non-active area N/A, various components for driving the plurality of sub-pixels SPX disposed in the active area A/A can be disposed. For example, a driving IC configured to supply a signal for driving the plurality of sub-pixels SPX, a flexible film, etc. can be disposed in the non-active area N/A.

The non-active area N/A can be a region surrounding the active area A/A as shown in FIG. 1, but is not limited thereto. For example, the non-active area N/A can be a region extended from the active area A/A.

Referring to FIG. 3, the substrate 110 serves to support and protect various components of the light emitting display device 100.

The substrate 110 can be formed of glass or a plastic material having flexibility. If the substrate 110 is formed of plastic material, it can be formed of, e.g., polyimide (PI), but is not limited thereto.

A buffer layer 111 can be disposed on the substrate 110. The buffer layer 111 functions to enhance adhesion between the substrate 110 and layers formed on the buffer layer 111 and block alkali elements discharged from the substrate 110.

The buffer layer 111 can be formed as a single layer of silicon nitride (SiNx) or silicon oxide (SiOx) or a multilayer of silicon nitride (SiNx) and/or silicon oxide (SiOx), but is not limited thereto. The buffer layer 111 can be omitted depending on the kind and material of the substrate 110 and a structure and type of the thin film transistor 120.

The thin film transistor 120 can be disposed on the substrate 110.

The thin film transistor 120 can be used as a driving element of the light emitting display device 100. The thin film transistor 120 can include a gate electrode 121, an active layer 122, a source electrode 123 and a drain electrode 124. In the light emitting display device 100 according to an exemplary embodiment of the present disclosure, the thin film transistor 120 is configured as a bottom gate thin film transistor in which the active layer 122 is disposed on the gate electrode 121 and the source electrode 123 and the drain electrode 124 are disposed on the active layer 122 and the gate electrode 121 is disposed at the most bottom, but is not limited thereto.

The gate electrode 121 can be disposed on the substrate 110. The gate electrode 121 can be formed of any one of various metal materials such as molybdenum (Mo), aluminum (Al), chromium (Cr), gold (Au), titanium (Ti), nickel (Ni), neodymium (Nd), and copper (Cu) or an alloy of two or more of them, or a multilayer thereof, but is not limited thereto.

The gate insulating layer 112 can be disposed on the gate electrode 121. The gate insulating layer 112 is an insulating layer serving to electrically insulate the gate electrode 121 from the active layer 122. The gate insulating layer 112 can be formed of an insulating material. For example, the gate insulating layer 112 can be formed as a single layer of silicon nitride (SiNx) or silicon oxide (SiOx) or a multilayer of silicon nitride (SiNx) and/or silicon oxide (SiOx), but is not limited thereto.

The active layer 122 can be disposed on the gate insulating layer 112.

The active layer 122 can be disposed so as to overlap the gate electrode 121.

For example, the active layer 122 can be formed of an oxide semiconductor, amorphous silicon (a-Si), polycrystalline silicon (poly-Si), or an organic semiconductor.

An etch stopper 117 can be disposed on the active layer 122.

The etch stopper 117 can be formed to suppress damage to a back channel surface of the active layer 122 by plasma when the source electrode 123 and the drain electrode 124 are patterned and formed by etching.

One end of the etch stopper 117 can overlap the source electrode 123 and the other end thereof can overlap the drain electrode 124. The etch stopper 117 can also be omitted.

The source electrode 123 and the drain electrode 124 can be disposed on the active layer 122 and the etch stopper 117. The source electrode 123 and the drain electrode 124 can be disposed apart from each other on the same layer.

The source electrode 123 and the drain electrode 124 can be electrically connected with the active layer 122 by contact with the active layer 122.

The source electrode 123 and the drain electrode 124 can be formed of any one of various metal materials such as molybdenum (Mo), aluminum (Al), chromium (Cr), gold (Au), titanium (Ti), nickel (Ni), neodymium (Nd), and copper (Cu) or an alloy of two or more of them, or a multilayer thereof, but are not limited thereto.

A passivation layer 113 can be disposed on the thin film transistor 120. The passivation layer 113 can serve to protect the thin film transistor 120 and can be formed as a single layer of silicon nitride (SiNx) or silicon oxide (SiOx) or a multilayer of silicon nitride (SiNx) and/or silicon oxide (SiOx), but is not limited thereto. The passivation layer 113 can also be omitted.

The first overcoating layer 141 can be disposed on the passivation layer 113. The first overcoating layer 141 is an insulating layer serving to protect the thin film transistor 120 and reduce a step difference between layers disposed on the substrate 110. The first overcoating layer 141 can be formed of any one of acrylic-based resin, epoxy resin, phenol resin, polyamide-based resin, polyimide-based resin, unsaturated polyester-based resin, polyphenylene-based resin, benzocyclobutene, photoresist and poly(phenylenesulfide)-based resin, but is not limited thereto.

The first overcoating layer 141 can be disposed on the thin film transistor 120. A top surface of the first overcoating layer 141 can be parallel with the substrate 110. Thus, the first overcoating layer 141 can planarize a step difference which can be caused by components disposed under the first overcoating layer 141.

A connection electrode 125 can be disposed on the first overcoating layer 141.

The connection electrode 125 can be electrically connected with the drain electrode 124 through a contact hole formed in the first overcoating layer 141 and the passivation layer 113, but is not limited thereto. The connection electrode 125 can also be electrically connected with the source electrode 123 through the contact hole formed in the first overcoating layer 141 and the passivation layer 113.

The connection electrode 125 can be formed of any one of various metal materials such as molybdenum (Mo), aluminum (Al), chromium (Cr), gold (Au), titanium (Ti), nickel (Ni), neodymium (Nd), and copper (Cu) or an alloy of two or more of them, or a multilayer thereof, but is not limited thereto.

The sacrificial layer 145 can be disposed on the connection electrode 125 and the first overcoating layer 141.

The sacrificial layer 145 can be disposed on the first overcoating layer 141 so as to cover an edge of the connection electrode 125. For example, the sacrificial layer 145 can expose at least the surface of the connection electrode 125 in an emission area EA.

The sacrificial layer 145 can be formed to a greater thickness than the first electrode 131 to form an undercut structure at an edge of the first electrode 131. For example, if the thickness of the first electrode 131 is set to 92.3% or less of that of the sacrificial layer 145, an undercut structure of the present disclosure can be formed.

The sacrificial layer 145 can be patterned to have a positive taper at an edge thereof.

The sacrificial layer 145 can be formed as a single layer of silicon nitride (SiNx) or silicon oxide (SiOx) or a multilayer of silicon nitride (SiNx) and/or silicon oxide (SiOx), but is not limited thereto. For example, the sacrificial layer 145 can be formed as a double layer of silicon nitride (SiNx) and silicon oxide (SiOx) to a thickness of 1300 Å to 2500 Å.

The first electrode 131 can be disposed on the connection electrode 125.

The first electrode 131 can be disposed on the surface of the connection electrode 125 which is not covered by the sacrificial layer 145 and whose surface is exposed. The first electrode 131 can also be disposed inside the undercut structure at a bottom portion of a side surface of the second overcoating layer 142 so as to be in contact with a side surface of the sacrificial layer 145.

The first electrode 131 can be formed by deposition without performing a mask process.

Contrary to the sacrificial layer 145, the first electrode 131 can be deposited to have an inverse taper at an edge thereof.

The thickness of the first electrode 131 can be set to 92.3% or less of that of the sacrificial layer 145 to form an undercut structure at an edge of the first electrode 131.

The surface of the first electrode 131 can be substantially flat, but is not limited thereto. A part of the edge of the first electrode 131 can have an uneven structure.

Further, a reflective layer electrically connected with the thin film transistor 120 and a transparent conductive layer disposed on the reflective layer can be included in the first electrode 131. However, the present disclosure is not limited thereto. The first electrode 131 can have a three-layer structure including a transparent conductive layer, a reflective layer and a transparent conductive layer.

The reflective layer can be disposed on the connection electrode 125. The light emitting display device 100 according to an exemplary embodiment of the present disclosure is a top emission type light emitting display device. Therefore, the reflective layer can reflect light emitted from the light emitting element 130 in an upward direction.

The reflective layer can be formed of a metal material such as aluminum (Al), silver (Ag), copper (Cu), a magnesium-silver alloy, or the like, but is not limited thereto.

The reflective layer can be electrically connected with the drain electrode 124 through the connection electrode 125, but is not limited thereto. The reflective layer can also be electrically connected with the source electrode 123 through the connection electrode 125.

The transparent conductive layer can be disposed on the reflective layer. The transparent conductive layer can be disposed on the reflective layer and electrically connected with the drain electrode through the reflective layer and the connection electrode 125. The transparent conductive layer can be formed of a conductive material having a high work function to supply holes to the emission layer 132.

For example, the transparent conductive layer can be formed of a transparent conductive oxide such as indium tin oxide (ITO), indium zinc oxide (IZO), indium tin zinc oxide (ITZO), zinc oxide (ZnO) and tin oxide (TO), but is not limited thereto.

The second overcoating layer 142 can be disposed on the first electrode 131 and the sacrificial layer 145.

The second overcoating layer 142 can be formed to expose the entire surface of the first electrode 131 except an edge of the first electrode 131.

The side surface of the second overcoating layer 142 where the first electrode 131 is exposed can have a taper having a predetermined angle. For example, the side surface of the second overcoating layer 142 can be tapered at an angle of 30° to 60°, but is not limited thereto.

The second overcoating layer 142 can include a top surface and a side surface.

The top surface of the second overcoating layer 142 is located at the uppermost portion of the second overcoating layer 142 and can be substantially parallel with the substrate 110.

The side surface of the second overcoating layer 142 can be a surface extended from the top surface to the side surface of the second overcoating layer 142.

The second overcoating layer 142 can be formed of the same material as the first overcoating layer 141.

For example, the second overcoating layer 142 can be formed of any one of acrylic-based resin, epoxy resin, phenol resin, polyamide-based resin, polyimide-based resin, unsaturated polyester-based resin, polyphenylene-based resin, benzocyclobutene, photoresist and poly(phenylenesulfide)-based resin, but is not limited thereto.

The second overcoating layer 142 can have an undercut structure at a bottom portion of the side surface by additionally etching the sacrificial layer 145 from the side surface to the inside of the second overcoating layer 142.

An etch bias which is the distance from the end of the side surface of the second overcoating layer 142 to the end of the sacrificial layer 145 varies depending on process conditions and can be in the range of 0.8 μm to 1.3 μm.

A dummy first electrode 131' formed of the same material as the first electrode 131 can be disposed on the top surface and the side surface of the second overcoating layer 142. Therefore, like the first electrode 131, the dummy first electrode 131' can include a reflective layer and a transparent conductive layer disposed on the reflective layer, but is not limited thereto. The dummy first electrode 131' can have a three-layer structure including a transparent conductive layer, a reflective layer and a transparent conductive layer.

The dummy first electrode 131' can be deposited on the top surface and the side surface of the second overcoating layer 142 when the first electrode 131 is deposited. Also, the dummy first electrode 131' can be separated from the first electrode 131 by the undercut structure of the second overcoating layer 142.

As such, the first electrode 131 is separated from the dummy first electrode 131' in a sub-pixel, and, thus, the first electrode 131 and the dummy first electrode 131' can be formed by whole-surface deposition without a mask.

The dummy first electrode 131' can be disposed on the top surface and the side surface of the second overcoating layer 142 along the shape of the second overcoating layer 142.

The dummy first electrode 131' disposed on the side surface of the second overcoating layer 142 can be tapered at an angle of 30° to 60°, but is not limited thereto.

The light emitting display device 100 according to an exemplary embodiment of the present disclosure is a top emission type light emitting display device. Therefore, the reflective layer of the dummy first electrode 131' can reflect light emitted from the light emitting element 130 in an upward direction. Light generated from the emission layer 132 of the light emitting element 130 is emitted not only in the upward direction but also in a side direction. The light emitted in the side direction can travel to the inside of the light emitting display device 100 and can be confined inside the light emitting display device 100 by total reflection. Further, the light can disappear while traveling to the inside of the light emitting display device 100. Thus, the reflective layer of the dummy first electrode 131' can be disposed covering the side surface of the second overcoating layer 142. Therefore, a traveling direction of light can be changed from the side direction to the upward direction (refer to the arrow in FIG. 3).

The bank layer 114 can be disposed on the second overcoating layer 142.

The bank layer 114 can be disposed on the second overcoating layer 142 so as to cover the entire dummy first electrode 131' and a part of an edge of the first electrode 131. The bank layer 114 can fill the inside of the undercut structure at a bottom end of the side surface of the second overcoating layer 142. Thus, the bank layer 114 can be interposed between the first electrode 131 and the dummy first electrode 131'.

The bank layer 114 can cover a part of an edge of the first electrode 131 throughout a plurality of sub-pixels SPX to define the emission area EA and a non-emission area NEA. For example, in the non-emission area NEA, the bank layer 114 is disposed on the first electrode 131 to block the generation of light from the non-emission area NEA. Meanwhile, in the emission area EA, the bank layer 114 is not disposed, but the emission layer 132 is located right on the first electrode 131. Thus, light can be generated from the emission layer 132.

The bank layer 114 can be formed of an organic material or an inorganic material.

For example, the bank layer 114 can be formed of an organic material such as polyimide, acryl or benzocyclobutene, or an inorganic material such as silicon nitride (SiNx) or silicon oxide (SiOx), but is not limited thereto.

The emission layer 132 and the second electrode 133 can be disposed on the bank layer 114. The emission layer 132 and the second electrode 133 can form the light emitting element 130 together with the first electrode 131.

The emission layer 132 can be disposed to be in contact with the first electrode 131 throughout a plurality of sub-pixels SPX. For example, the emission layer 132 can be disposed on the first electrode 131 throughout the entire surface of the substrate 110, but is not limited thereto. The emission layer 132 can be disposed on the first electrode 131 only in the emission area EA.

In this case, the emission layer 132 can be disposed to be surrounded by the bank layer 114.

The emission layer 132 serves to emit light of a specific color and has a structure separated for each of sub-pixels SPX. For example, the emission layer 132 disposed in the first sub-pixel SPX1 as a red sub-pixel is a red emission layer, and the emission layer 132 disposed in the second sub-pixel SPX2 as a green sub-pixel is a green emission layer. Also, the emission layer 132 disposed in the third sub-pixel SPX3 as a blue sub-pixel is a blue emission layer. The emission layer 132 disposed in the first sub-pixel SPX1, the emission layer 132 disposed in the second sub-pixel SPX2 and the emission layer 132 disposed in the third sub-pixel SPX3 can be separated from each other to be disposed.

The emission layer 132 can further include various layers such as a hole transport layer, a hole injection layer, a hole blocking layer, an electron injection layer, an electron blocking layer and an electron transport layer. Further, the emission layer 132 can be an organic emission layer formed of an organic material, but is not limited thereto. For example, the emission layer 132 can also be formed of a quantum dot emission layer or micro LEDs.

The second electrode 133 can be disposed on the emission layer 132 in a sub-pixel SPX. For example, the second electrode 133 is disposed in contact with the emission layer 132 along the shape of the emission layer 132 in the emission area EA and the non-emission area NEA, but is not limited thereto.

The second electrode 133 can supply electrons to the emission layer 132. The second electrode 133 can be formed of a metal material such as silver (Ag), copper (Cu), a magnesium-silver alloy, or the like, but is not limited thereto. If the second electrode 133 is formed of a metal material, it has a very low refractive index. For example, if the second electrode 133 is formed of silver (Ag), the second electrode 133 can have a refractive index of about 0.13.

The light emitting display device 100 according to an exemplary embodiment of the present disclosure is a top emission type light emitting display device. Therefore, it can be fabricated to implement a micro cavity. For example, in the light emitting display device 100 according to an exemplary embodiment of the present disclosure, the distance between the reflective layer of the first electrode 131 and the second electrode 133 is set to implement constructive interference of light emitted from the emission layer 132. Thus, the light efficiency can be improved. Therefore, in the light emitting display device 100 according to an exemplary embodiment of the present disclosure, the emission layer 132 have different thicknesses for the respective sub-pixels SPX to implement a micro cavity.

Referring to FIG. 3, the encapsulation layer 150 can be disposed on the second electrode 133. The encapsulation layer 150 can block the permeation of oxygen and moisture into the light emitting display device 100 from the outside. For example, if the light emitting display device 100 is exposed to moisture or oxygen, pixel contraction can occur so that the emission area EA is reduced, or dark spots can occur in the emission area EA. Thus, the encapsulation layer 150 can block oxygen and moisture to protect the light emitting display device 100.

A first encapsulation layer, a second encapsulation layer and a third encapsulation layer can be include in the encapsulation layer 150.

The first encapsulation layer can be disposed on the second electrode 133 to suppress the permeation of moisture or oxygen.

Herein, the first encapsulation layer can be formed of an inorganic material such as silicon nitride (SiNx), silicon oxynitride (SiOxNy) or aluminum oxide (AlyOz), but is not limited thereto. The first encapsulation layer can be formed of a material having a higher refractive index than the second encapsulation layer. For example, if the first encapsulation layer is formed of silicon nitride (SiNx) or silicon oxynitride (SiOxNy), the refractive index of the first encapsulation layer can be about 1.8.

The second encapsulation layer can be disposed on the first encapsulation layer to planarize the surface of the first encapsulation layer. Further, the second encapsulation layer can cover foreign materials or particles which can be produced during a fabricating process. The second encapsulation layer can be formed of an organic material such as silicon oxycarbide (SiOxCz) or acryl-based or epoxy-based resin, but is not limited thereto. The second encapsulation layer can be formed of a material having a lower refractive index than the first encapsulation layer. For example, if the second encapsulation layer is formed of acryl-based resin, the refractive index of the second encapsulation layer can be from about 1.5 to about 1.6.

The third encapsulation layer can be disposed on the second encapsulation layer and can suppress the permeation of moisture or oxygen like the first encapsulation layer.

For example, the third encapsulation layer can be formed of an inorganic material such as silicon nitride (SiNx), silicon oxynitride (SiOxNy), silicon oxide (SiOx) or aluminum oxide (AlyOz), but is not limited thereto. The third encapsulation layer can be formed of the same material as the first encapsulation layer or can be formed of a different material from the first encapsulation layer.

As for a conventional light emitting display device, some light confined and lost in the light emitting display device among light emitted from an emission layer causes a decrease in light efficiency. For example, among light emitted from the emission layer, some light may not be extracted to the outside of the light emitting display device due to a total reflection loss or a waveguide loss. Thus, the light extraction efficiency of the light emitting display device decreases. For example, as for the conventional light emitting display device, a first electrode is disposed only on an overcoating layer having a flat top surface. Therefore, among light emitted from the emission layer, second light output at a low output angle can be confined in the light emitting display device due to a total reflection loss or a waveguide loss.

Thus, the light emitting display device 100 according to an exemplary embodiment of the present disclosure uses the second overcoating layer 142 having a side surface to improve the light extraction efficiency of the light emitting element 130. For example, in the light emitting display device 100 according to an exemplary embodiment of the present disclosure, the second overcoating layer 142 having a top surface and a side surface is disposed on the first overcoating layer 141. Also, a reflective layer of the dummy first electrode 131' is disposed to cover at least the side surface of the second overcoating layer 142. Therefore, among light emitted from the emission layer 132 of the light emitting display device 100, second light output at a low output angle can be extracted toward the top surface by the reflective layer of the dummy first electrode 131' disposed on the side surface of the second overcoating layer 142. For example, if only the first electrode is disposed on the flat overcoating layer as in the conventional light emitting display device, light traveling toward the side surface, for example, light output at a low output angle, may not travel toward the top surface. Also, the light may not be extracted to the outside of the light emitting display device due to a total reflection loss or a waveguide loss. However, in the light emitting display device 100 according to an exemplary embodiment of the present disclosure, first light output toward the top surface from the emission layer 132 together with second light output at a low output angle from the emission layer 132 can be reflected by the reflective layer of the dummy first electrode 131' disposed on the side surface of the second overcoating layer 142 and extracted toward the top surface.

Therefore, in the light emitting display device 100 according to an exemplary embodiment of the present disclosure, the reflective layer of the dummy first electrode 131' disposed on the side surface of the second overcoating layer 142 serves as a side mirror. Thus, light which can be lost in the light emitting display device 100 can be extracted toward the top surface. Therefore, light extraction efficiency can be improved and power consumption can be reduced.

In the light emitting display device 100 according to an exemplary embodiment of the present disclosure, the first electrode 131 is separated from the dummy first electrode 131' disposed on the side surface of the second overcoating layer 142. Therefore, it is possible to suppress contact resistance and leakage issues.

Meanwhile, an OLED side mirror (OSM) structure in which a mirror-shaped anode is additionally formed on a side surface of an emission layer can be implemented by laminating two overcoating layers or adding a connection electrode between the anode and a drain electrode.

In this case, if two overcoating layers are laminated, when the anode is brought into contact with the drain electrode, there can be no lighting due to a residual film of the overcoating layers in a contact hole region.

Thus, the connection electrode can be inserted between the anode and the drain electrode and each of the first and second overcoating layers can be used for a mask process to reduce the generation of a residual film of the overcoating layers. However, in this case, if there is a small margin between a bank layer and the second overcoating layer, a leakage current can be generated from a reflective layer of the anode. Otherwise, foreign materials can cause a short circuit between the emission layer and the anode and a cathode.

Thus, in the present disclosure, the first electrode 131 is separated from the dummy first electrode 131' disposed on the side surface of the second overcoating layer 142 to improve short-circuit failure and contact resistance. Also, in the present disclosure, the first electrode 131 and the dummy first electrode 131' are formed by deposition without using a mask and the sacrificial layer 145 is patterned without performing an additional mask process. Thus, it is possible to improve processability and reduce manufacturing costs.

For example, the present disclosure features the reflective layer of the dummy first electrode 131' formed on the side surface of the second overcoating layer 142.

Also, the present disclosure features an undercut structure formed at the bottom end of the side surface of the second overcoating layer 142. Thus, the dummy first electrode 131' and the first electrode 131 are formed separately through the same process.

Further, the present disclosure features the first electrode 131 electrically connected with the drain electrode 124 through the connection electrode 125 under the first electrode 131.

Furthermore, the present disclosure features the dummy first electrode 131' disposed on the side surface of the second overcoating layer 142 and tapered at an angle of 30° to 60°.

Also, in the present disclosure, the distance between the bank layer 114 and the dummy first electrode 131' can be controlled in a range in which the first electrode 131 does not cover all the exposed opening.

Further, in the present disclosure, the sacrificial layer 145 has a greater thickness than the first electrode 131 to form an undercut structure at an edge of the first electrode 131.

Furthermore, in the present disclosure, the connection electrode 125 is formed greater in size than the first electrode 131 to improve contact resistance.

Meanwhile, in the light emitting display device according to an exemplary embodiment of the present disclosure, the entire surface of the first electrode is substantially flat, but is not limited thereto. In the present disclosure, a part of an edge of the first electrode can have an uneven structure. This will be described in detail with reference to another exemplary embodiment of the present disclosure.

Figure 4:
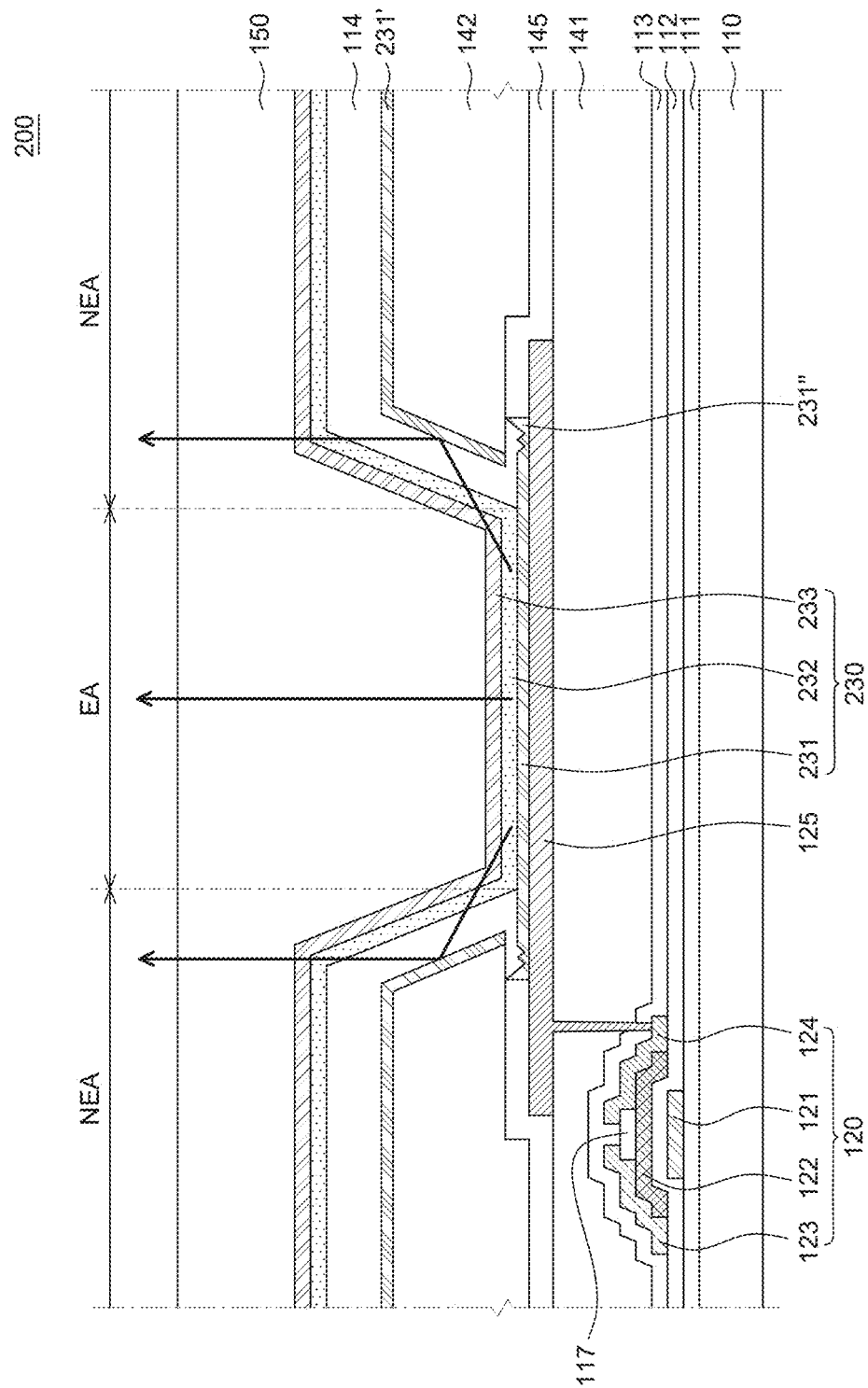
FIG. 4 is a cross-sectional view of a light emitting display device according to another exemplary embodiment of the present disclosure.

FIG. 4 is a cross-sectional view of a light emitting display device according to another exemplary embodiment of the present disclosure.

Figure 5:
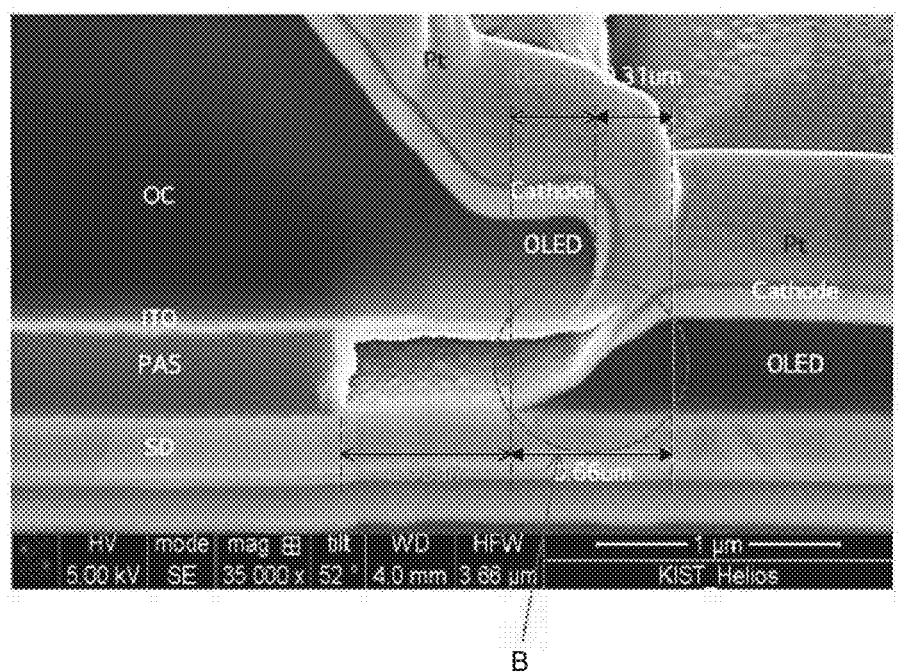
FIG. 5 is a photograph showing an example of an undercut structure of an anode of the present disclosure.

FIG. 5 is a photograph showing an example of an undercut structure of an anode of the present disclosure.

Figure 6:
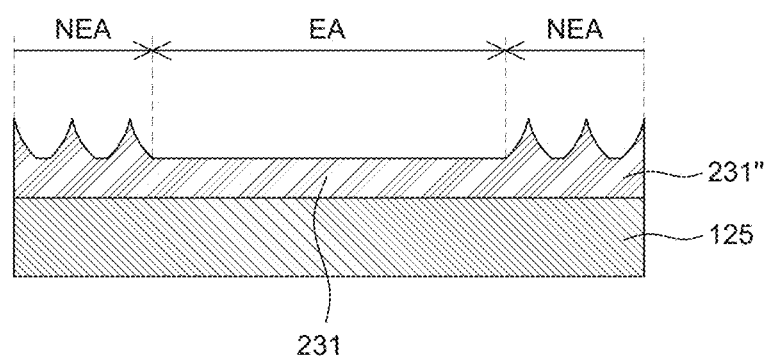
FIG. 6 is a cross-sectional view illustrating an example of an uneven structure on the outer periphery of the anode according to another exemplary embodiment of the present disclosure.

FIG. 6 is a cross-sectional view illustrating an example of an uneven structure on the outer periphery of the anode according to another exemplary embodiment of the present disclosure.

Figure 7:
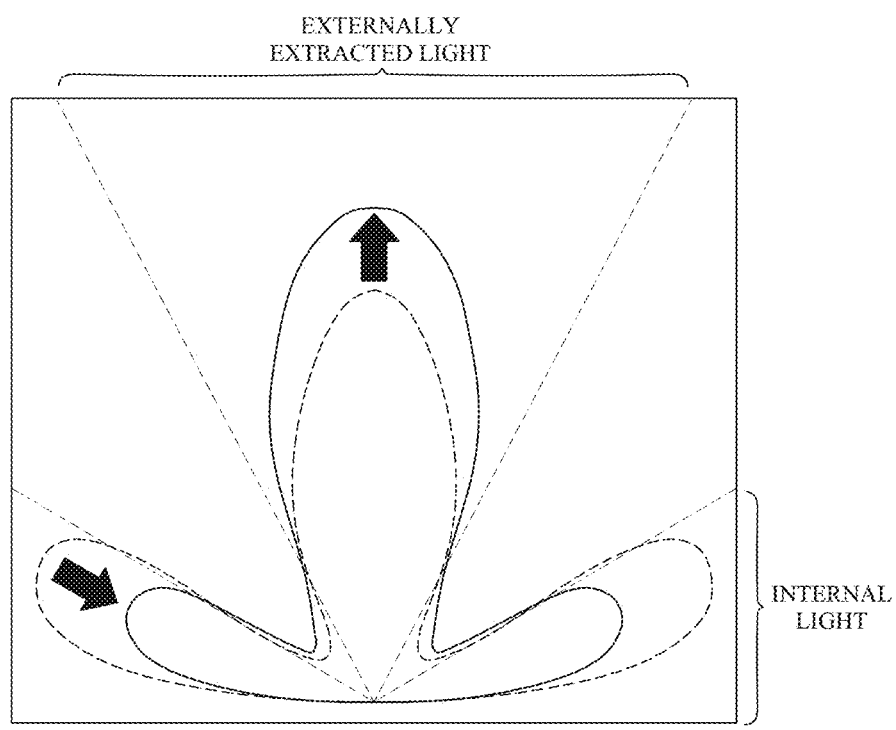
FIG. 7 shows a result of light extraction simulation using the uneven structure on the outer periphery of the anode.

FIG. 7 shows the result of light extraction simulation using the uneven structure on the outer periphery of the anode.

FIG. 8A through FIG. 8H are photographs showing examples of the formation of a positive taper formation and an etch bias level depending on the thickness of a sacrificial layer according to an embodiment of the present disclosure.

A light emitting display device 200 illustrated in FIG. 4 is substantially the same as the light emitting display device 100 illustrated in FIG. 2 and FIG. 3 except that an uneven structure 231" is formed at an edge of a first electrode 231.

Referring to FIG. 4, the light emitting display device 200 according to another exemplary embodiment of the present disclosure can include the substrate 110, the thin film transistor 120, a light emitting element 230, the first and second overcoating layers 141 and 142, the bank layer 114, the sacrificial layer 145 and the encapsulation layer 150.

The light emitting display device 200 can be implemented as a top emission type light emitting display device.

The substrate 110 serves to support and protect various components of the light emitting display device 200.

The buffer layer 111 can be disposed on the substrate 110. The buffer layer 111 functions to enhance adhesion between the substrate 110 and layers formed on the buffer layer 111 and block alkali elements discharged from the substrate 110.

The thin film transistor 120 can be disposed on the substrate 110.

The thin film transistor 120 can be used as a driving element of the light emitting display device 200. The thin film transistor 120 can include the gate electrode 121, the active layer 122, the source electrode 123 and the drain electrode 124. In the light emitting display device 200 according to another exemplary embodiment of the present disclosure, the thin film transistor 120 is configured as a bottom gate thin film transistor in which the active layer 122 is disposed on the gate electrode 121 and the source electrode 123 and the drain electrode 124 are disposed on the active layer 122 and the gate electrode 121 is disposed at the most bottom, but is not limited thereto.

The gate electrode 121 can be disposed on the substrate 110.

The gate insulating layer 112 can be disposed on the gate electrode 121. The gate insulating layer 112 is an insulating layer serving to electrically insulate the gate electrode 121 from the active layer 122. The gate insulating layer 112 can be formed of an insulating material.

The active layer 122 can be disposed on the gate insulating layer 112.

The active layer 122 can be disposed so as to overlap the gate electrode 121.

The etch stopper 117 can be disposed on the active layer 122.

The etch stopper 117 can be formed to suppress damage to a back channel surface of the active layer 122 by plasma when the source electrode 123 and the drain electrode 124 are patterned and formed by etching.

One end of the etch stopper 117 can overlap the source electrode 123 and the other end thereof can overlap the drain electrode 124. The etch stopper 117 can also be omitted.

The source electrode 123 and the drain electrode 124 can be disposed on the active layer 122 and the etch stopper 117. The source electrode 123 and the drain electrode 124 can be disposed apart from each other on the same layer.

The source electrode 123 and the drain electrode 124 can be electrically connected with the active layer 122 by contact with the active layer 122.

The passivation layer 113 can be disposed on the thin film transistor 120. The passivation layer 113 can serve to protect the thin film transistor 120 and can also be omitted.

The first overcoating layer 141 can be disposed on the passivation layer 113. The first overcoating layer 141 is an insulating layer serving to protect the thin film transistor 120 and reduce a step difference between layers disposed on the substrate 110.

The first overcoating layer 141 can be disposed on the thin film transistor 120. A top surface of the first overcoating layer 141 can be parallel with the substrate 110. Thus, the first overcoating layer 141 can planarize a step difference which can be caused by components disposed under the first overcoating layer 141.

The connection electrode 125 can be disposed on the first overcoating layer 141.

The connection electrode 125 can be electrically connected with the drain electrode 124 through the contact hole formed in the first overcoating layer 141 and the passivation layer 113, but is not limited thereto. The connection electrode 125 can also be electrically connected with the source electrode 123 through the contact hole formed in the first overcoating layer 141 and the passivation layer 113.

The sacrificial layer 145 can be disposed on the connection electrode 125 and the first overcoating layer 141.

The sacrificial layer 145 can be disposed on the first overcoating layer 141 so as to cover an edge of the connection electrode 125. For example, the sacrificial layer 145 can expose at least the surface of the connection electrode 125 in an emission area EA.

The sacrificial layer 145 can be formed to a greater thickness than the first electrode 231 to form an undercut structure at an edge of the first electrode 231. For example, if the thickness of the first electrode 231 is set to 92.3% or less of that of the sacrificial layer 145, an undercut structure of the present disclosure can be formed.

The sacrificial layer 145 can be patterned to have a positive taper at an edge thereof.

The sacrificial layer 145 can be formed as a single layer of silicon nitride (SiNx) or silicon oxide (SiOx) or a multilayer of silicon nitride (SiNx) and/or silicon oxide (SiOx), but is not limited thereto. For example, the sacrificial layer 145 can be formed as a double layer of silicon nitride (SiNx) and silicon oxide (SiOx) to a thickness of 1300 Å to 2500 Å.

The first electrode 231 can be disposed on the connection electrode 125.

The first electrode 231 can be disposed on the surface of the connection electrode 125 which is not covered by the sacrificial layer 145 and whose surface is exposed. The first electrode 231 can also be disposed inside the undercut structure at the bottom portion of the side surface of the second overcoating layer 142 so as to be in contact with a side surface of the sacrificial layer 145.

The first electrode 231 can be formed by deposition without performing a mask process.

Contrary to the sacrificial layer 145, the first electrode 231 can be deposited to have an inverse taper at an edge thereof.

The thickness of the first electrode 231 can be set to 92.3% or less of that of the sacrificial layer 145 to form an undercut structure at an edge of the first electrode 231.

A part of the surface of the first electrode 231 can be substantially flat, but a part of the edge of the first electrode 231 can have the uneven structure 231" (refer to FIG. 6).

Referring to FIG. 7, in the result of simulation, the dotted lines represent a flat structure and the solid lines represent the uneven structure 231".

In the flat structure, light is confined in a wave guide and an SP mode and thus is difficult to extract to the outside, which can result in degradation of external light extraction efficiency. However, by the application of the uneven structure 231", it is possible to extract light confined inside toward a top surface and thus improve the light extraction efficiency.

For example, if a part of the edges of the first electrode 231 is not flat and has the uneven structure 231", a wave guide and an SP mode can be extracted. Thus, it is possible to contribute to an efficiency enhancement at the top surface.

Referring to FIG. 4, the first electrode 231 can include a reflective layer electrically connected with the thin film transistor 120 and a transparent conductive layer disposed on the reflective layer, but is not limited thereto. The first electrode 231 can have a three-layer structure including a transparent conductive layer, a reflective layer and a transparent conductive layer.

The reflective layer can be disposed on the connection electrode 125. The light emitting display device 200 according to another exemplary embodiment of the present disclosure is a top emission type light emitting display device. Therefore, the reflective layer can reflect light emitted from the light emitting element 230 in an upward direction.

The reflective layer can be electrically connected with the drain electrode 124 through the connection electrode 125, but is not limited thereto. The reflective layer can also be electrically connected with the source electrode 123 through the connection electrode 125.

The transparent conductive layer can be disposed on the reflective layer. The transparent conductive layer can be disposed on the reflective layer and electrically connected with the drain electrode through the reflective layer and the connection electrode 125. The transparent conductive layer can be formed of a conductive material having a high work function to supply holes to an emission layer 232.

The second overcoating layer 142 can be disposed on the first electrode 231 and the sacrificial layer 145.

The second overcoating layer 142 can be formed to expose the entire surface of the first electrode 231 except an edge, i.e., the uneven structure 231", of the first electrode 231.

The side surface of the second overcoating layer 142 where the first electrode 231 is exposed can have a taper having a predetermined angle. For example, the side surface of the second overcoating layer 142 can be tapered at an angle of 30° to 60°, but is not limited thereto.

The second overcoating layer 142 can include a top surface and a side surface.

The top surface of the second overcoating layer 142 is located at the uppermost portion of the second overcoating layer 142 and can be substantially parallel with the substrate 110.

The side surface of the second overcoating layer 142 can be a surface extended from the top surface to the side surface of the second overcoating layer 142.

The second overcoating layer 142 can be formed of the same material as the first overcoating layer 141.

The second overcoating layer 142 can have an undercut structure at a bottom portion of the side surface by additionally etching the sacrificial layer 145 from the side surface to the inside of the second overcoating layer 142.

An etch bias which is the distance from the end of the side surface of the second overcoating layer 142 to the end of the sacrificial layer 145 varies depending on process conditions and can be in the range of 0.8 μm to 1.3 μm.

In the present disclosure, the sacrificial layer 145 was formed as a double layer of silicon nitride (SiNx) and silicon oxide (SiOx) to various thicknesses to evaluate an undercut structure.

For example, the sacrificial layer 145 was formed as a double layer of silicon nitride (SiNx) and silicon oxide (SiOx) to respective thicknesses of 300 Å and 1000 Å, 500 Å and 1000 Å, 300 Å and 2000 Å, and 500 Å and 2000 Å.

Also, each of a first electrode 331 and a dummy first electrode 331' was deposited into three layers of ITO, reflective layer and ITO to respective thicknesses of 100 Å, 1000 Å and 100 Å.

In this case, it can be seen that the thickness ratio of each of the first electrode 331 and the dummy first electrode 331' to the sacrificial layer 145 is 92.3%, 80.0%, 52.2% and 48.0%.

Referring to FIG. 8A through FIG. 8H, it can be seen that when the thickness ratio of each of the first electrode 331 and the dummy first electrode 331' to the sacrificial layer 145 is 92.3% or less, a positive taper is formed by etching the sacrificial layer 145. Also, the first electrode 331 and the dummy first electrode 331' can be separated from each other. Further, it can be seen that an etch bias which is the distance from the end of the side surface of the second overcoating layer 142 to the end of the sacrificial layer 145 varies depending on process conditions and is in the range of 0.8 µm to 1.3 µm.

Figure 8A:
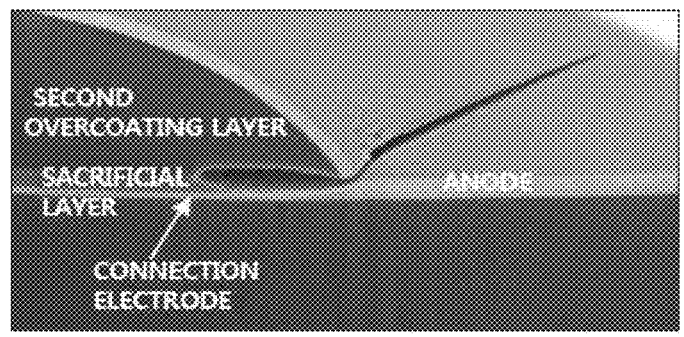
FIG. 8A through FIG. 8H are photographs showing examples of the formation of a positive taper formation and an etch bias level depending on the thickness of a sacrificial layer.
Figure 8B:
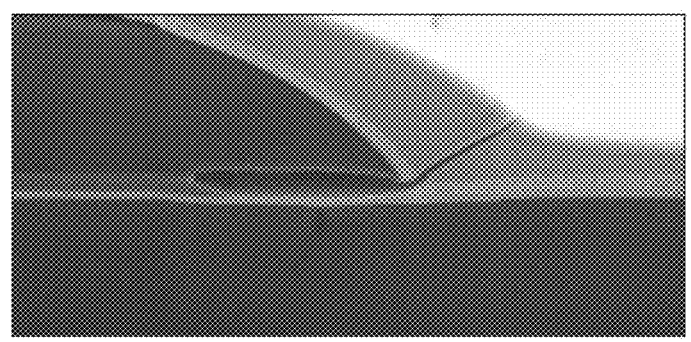
Figure 8C:
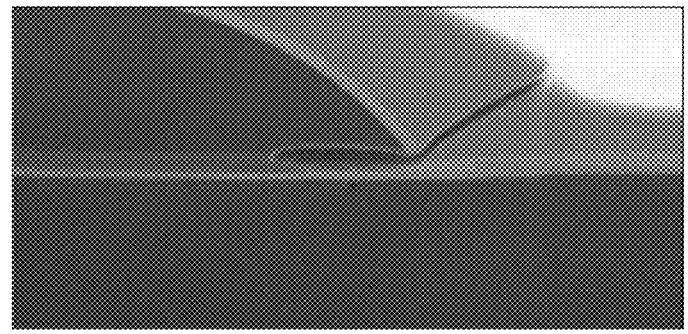
Figure 8D:
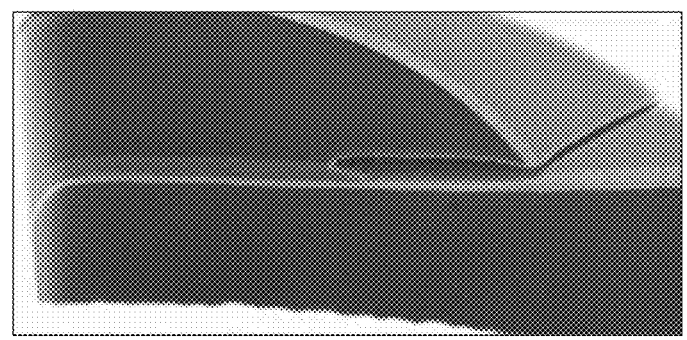

FIG. 8A shows an example where the etch bias is 0.8 µm, FIG. 8B shows an example where the etch bias is 1.2 µm, FIG. 8C shows an example where the etch bias is 0.75 µm and FIG. 8D shows an example where the etch bias is 1.1 µm.

Figure 8E:
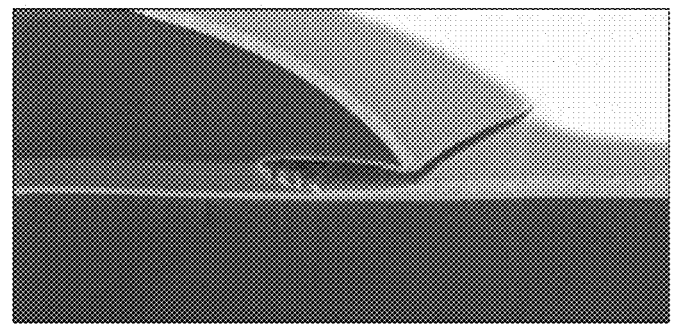
Figure 8F:
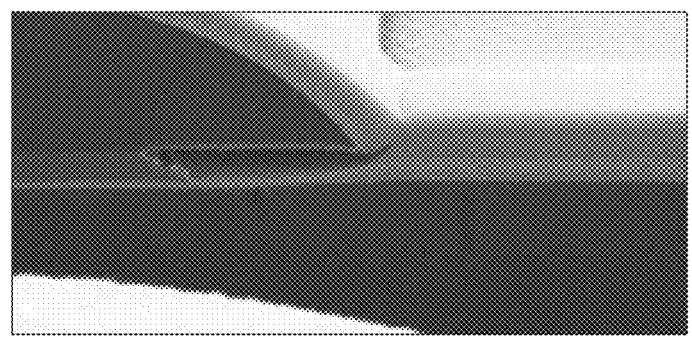
Figure 8G:
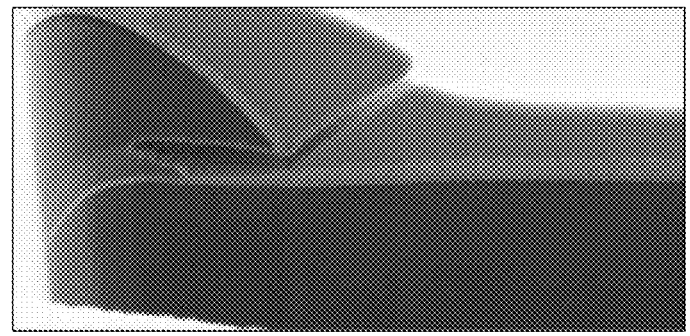
Figure 8H:
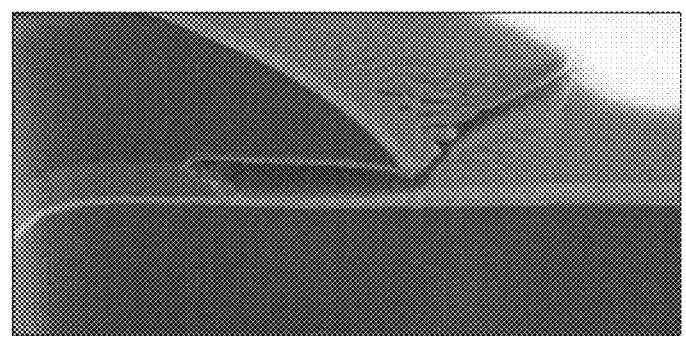

Also, FIG. 8E shows an example where the etch bias is 0.9 µm, FIG. 8F shows an example where the etch bias is 1.3 µm, FIG. 8G shows an example where the etch bias is 0.9 µm and FIG. 8H shows an example where the etch bias is 1.3 µm.

Referring to FIG. 4 again, a dummy first electrode 231' formed of the same material as the first electrode 231 can be disposed on the top surface and the side surface of the second overcoating layer 142. Therefore, like the first electrode 231, the dummy first electrode 231' can include a reflective layer and a transparent conductive layer disposed on the reflective layer, but is not limited thereto. The dummy first electrode 231' can have a three-layer structure including a transparent conductive layer, a reflective layer and a transparent conductive layer.

The dummy first electrode 231' can be deposited on the top surface and the side surface of the second overcoating layer 142 when the first electrode 231 is deposited. Also, the dummy first electrode 231' can be separated from the first electrode 231 by the undercut structure of the second overcoating layer 142.

As such, the first electrode 231 is separated from the dummy first electrode 231' in a sub-pixel, and, thus, the first electrode 231 and the dummy first electrode 231' can be formed by whole-surface deposition without a mask.

The dummy first electrode 231' can be disposed on the top surface and the side surface of the second overcoating layer 142 along the shape of the second overcoating layer 142.

The dummy first electrode 231' disposed on the side surface of the second overcoating layer 142 can be tapered at an angle of 30° to 60°, but is not limited thereto.

The light emitting display device 200 according to another exemplary embodiment of the present disclosure is a top emission type light emitting display device. Therefore, the reflective layer of the dummy first electrode 231' can reflect light emitted from the light emitting element 230 in an upward direction. Light generated from the emission layer 232 of the light emitting element 230 is emitted not only in the upward direction but also in a side direction. The light emitted in the side direction can travel to the inside of the light emitting display device 200 and can be confined inside the light emitting display device 200 by total reflection. Further, the light can disappear while traveling to the inside of the light emitting display device 200. Thus, the reflective layer of the dummy first electrode 231' can be disposed covering the side surface of the second overcoating layer 142. Therefore, a traveling direction of light can be changed from the side direction to the upward direction (refer to the arrow in FIG. 4).

The bank layer 114 can be disposed on the second overcoating layer 142.

The bank layer 114 can be disposed on the second overcoating layer 142 so as to cover the entire dummy first electrode 231' and a part of an edge of the first electrode 231. The bank layer 114 can fill the inside of the undercut structure at the bottom end of the side surface of the second overcoating layer 142. Thus, the bank layer 114 can be interposed between the first electrode 231 and the dummy first electrode 231'.

The bank layer 114 can cover a part of an edge of the first electrode 231 throughout a plurality of sub-pixels SPX to define the emission area EA and the non-emission area NEA. For example, in the non-emission area NEA, the bank layer 114 is disposed on the first electrode 231 to block the generation of light from the non-emission area NEA. Meanwhile, in the emission area EA, the bank layer 114 is not disposed, but the emission layer 232 is located right on the first electrode 231. Thus, light can be generated from the emission layer 232.

The emission layer 232 and a second electrode 233 can be disposed on the bank layer 114. The emission layer 232 and the second electrode 233 can form the light emitting element 230 together with the first electrode 231.

The emission layer 232 can be disposed to be in contact with the first electrode 231 throughout a plurality of sub-pixels SPX. For example, the emission layer 232 can be disposed on the first electrode 231 throughout the entire surface of the substrate 110, but is not limited thereto. The emission layer 232 can be disposed on the first electrode 231 only in the emission area EA. In this case, the emission layer 232 can be disposed to be surrounded by the bank layer 114.

The second electrode 233 can be disposed on the emission layer 232 in a sub-pixel SPX. For example, the second electrode 233 is disposed in contact with the emission layer 232 along the shape of the emission layer 232 in the emission area EA and the non-emission area NEA, but is not limited thereto.

The light emitting display device 200 according to another exemplary embodiment of the present disclosure is a top emission type light emitting display device. Therefore, it can be fabricated to implement a micro cavity. For example, in the light emitting display device 200 according to another exemplary embodiment of the present disclosure, the distance between the reflective layer of the first electrode 231 and the second electrode 233 is set to implement constructive interference of light emitted from the emission layer 232. Thus, the light efficiency can be improved. Therefore, in the light emitting display device 200 according to another exemplary embodiment of the present disclosure, the emission layer 232 have different thicknesses for the respective sub-pixels SPX to implement a micro cavity.

Referring to FIG. 4, the encapsulation layer 150 can be disposed on the second electrode 233. The encapsulation layer 150 can block the permeation of oxygen and moisture into the light emitting display device 200 from the outside.

A first encapsulation layer, a second encapsulation layer and a third encapsulation layer can be include in the encapsulation layer 150.

The light emitting display device 200 according to another exemplary embodiment of the present disclosure uses the second overcoating layer 142 having a side surface to improve the light extraction efficiency of the light emitting element 230. For example, in the light emitting display device 200 according to another exemplary embodiment of the present disclosure, the second overcoating layer 142 having a top surface and a side surface is disposed on the first overcoating layer 141. Also, a reflective layer of the dummy first electrode 231' is disposed to cover at least the side surface of the second overcoating layer 142. Therefore, among light emitted from the emission layer 232 of the light emitting display device 200, second light output at a low output angle can be extracted toward a front surface by the reflective layer of the dummy first electrode 231' disposed on the side surface of the second overcoating layer 142. For example, in the light emitting display device 200 according to another exemplary embodiment of the present disclosure, first light output toward the front surface from the emission layer 232 together with second light output at a low output angle from the emission layer 232 can be reflected by the reflective layer of the dummy first electrode 231' disposed on the side surface of the second overcoating layer 142 and extracted toward the front surface.

Therefore, in the light emitting display device 200 according to another exemplary embodiment of the present disclosure, the reflective layer of the dummy first electrode 231' disposed on the side surface of the second overcoating layer 142 serves as a side mirror. Thus, light which can be lost in the light emitting display device 200 can be extracted toward the front surface. Therefore, light extraction efficiency can be improved and power consumption can be reduced.

In the light emitting display device 200 according to another exemplary embodiment of the present disclosure, the first electrode 231 is separated from the dummy first electrode 231' disposed on the side surface of the second overcoating layer 142. Therefore, it is possible to suppress contact resistance and leakage issues.

For example, in the present disclosure, the first electrode 231 is separated from the dummy first electrode 231' disposed on the side surface of the second overcoating layer 142 to improve short-circuit failure and contact resistance. Also, in the present disclosure, the first electrode 231 and the dummy first electrode 231' are formed by deposition without using a mask and the sacrificial layer 145 is patterned without performing an additional mask process. Thus, it is possible to improve processability and reduce manufacturing costs.

For example, the present disclosure features the reflective layer of the dummy first electrode 231' formed on the side surface of the second overcoating layer 142.

Also, the present disclosure features an undercut structure formed at the bottom end of the side surface of the second overcoating layer 142. Thus, the dummy first electrode 231' and the first electrode 231 are formed separately through the same process.

Further, the present disclosure features the first electrode 231 electrically connected with the drain electrode 124 through the connection electrode 125 under the first electrode 231.

Furthermore, the present disclosure features the dummy first electrode 231' disposed on the side surface of the second overcoating layer 142 and tapered at an angle of 30° to 60°.

Also, in the present disclosure, the distance between the bank layer 114 and the dummy first electrode 231' can be controlled in a range in which the first electrode 231 does not cover all the exposed opening.

Further, in the present disclosure, the sacrificial layer 145 has a greater thickness than the first electrode 231 to form an undercut structure at an edge of the first electrode 231.

Furthermore, in the present disclosure, the connection electrode 125 is formed greater in size than the first electrode 231 to improve contact resistance.

Meanwhile, in the light emitting display devices according to an exemplary embodiment and another exemplary embodiment of the present disclosure, an emission layer is formed on the entire surface of a substrate including the non-emission area NEA as well as the emission area EA. However, the present disclosure is not limited thereto. In the present disclosure, an emission layer can be formed only in the emission area EA, which will be described in detail with reference to yet another exemplary embodiment of the present disclosure.

Figure 9:
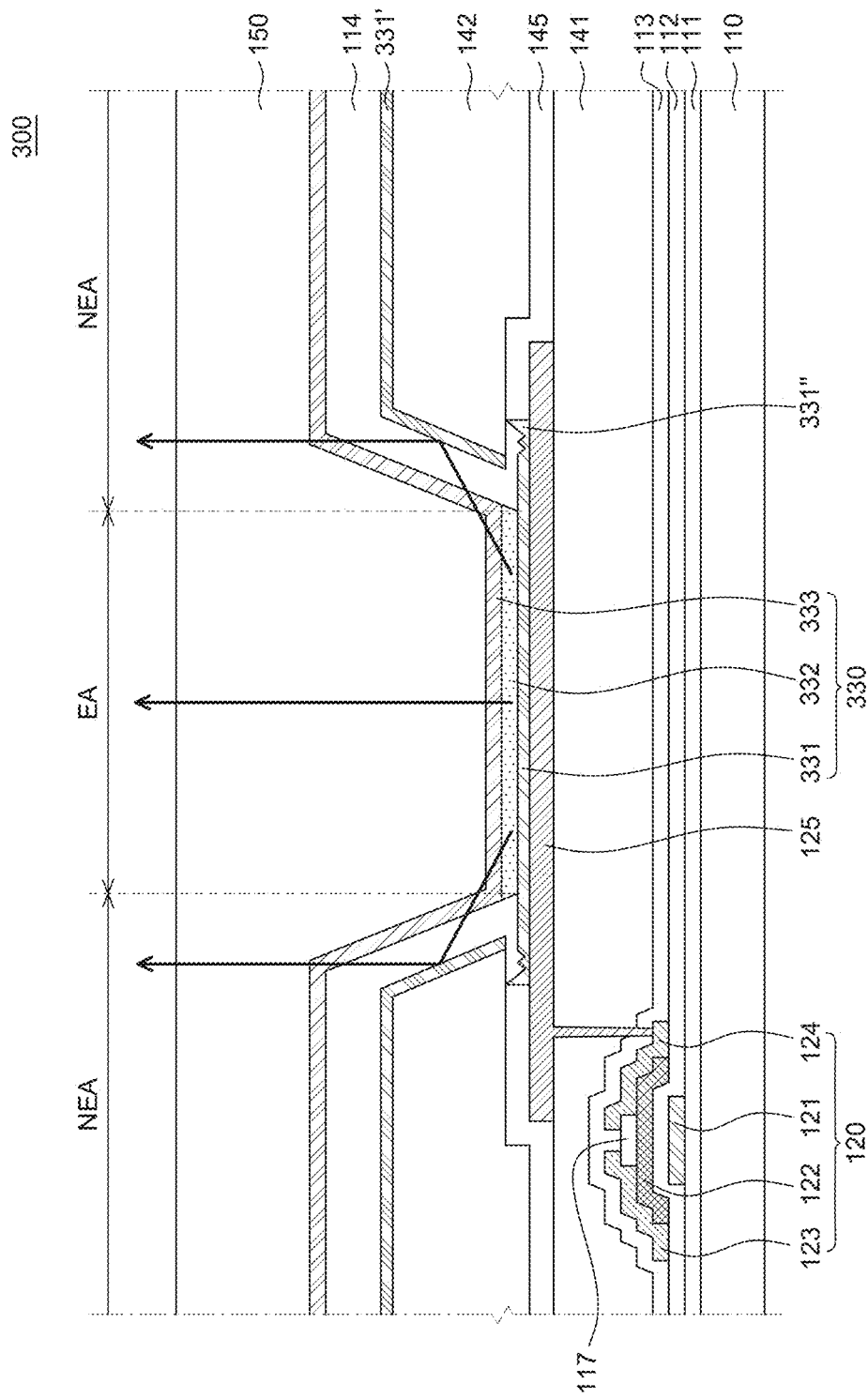
FIG. 9 is a plan view of a light emitting display device according to yet another exemplary embodiment of the present disclosure.

FIG. 9 is a plan view of a light emitting display device according to yet another exemplary embodiment of the present disclosure.

A light emitting display device 300 illustrated in FIG. 9 is substantially the same as the light emitting display device 200 illustrated in FIG. 4 except an emission layer 332 of a light emitting element 330. Thus, the redundant description thereof will be omitted or will be brief.

Referring to FIG. 9, the light emitting display device 300 according to yet another exemplary embodiment of the present disclosure can include the substrate 110, the thin film transistor 120, the light emitting element 330, the first and second overcoating layers 141 and 142, the bank layer 114, the sacrificial layer 145 and the encapsulation layer 150.

In this case, the emission layer 332 and a second electrode 333 can be disposed on the bank layer 114. The emission layer 332 and the second electrode 333 can form the light emitting element 330 together with a first electrode 331.

The emission layer 332 can be disposed to be in contact with the first electrode 331 throughout a plurality of sub-pixels SPX. For example, the emission layer 332 can be disposed on the first electrode 331 only in the emission area EA. In this case, the emission layer 332 can be disposed to be surrounded by the bank layer 114.

The emission layer 332 serves to emit light of a specific color and has a structure separated for each of sub-pixels SPX. For example, the emission layer 332 disposed in the first sub-pixel SPX1 as a red sub-pixel is a red emission layer, and the emission layer 332 disposed in the second sub-pixel SPX2 as a green sub-pixel is a green emission layer. Also, the emission layer 332 disposed in the third sub-pixel SPX3 as a blue sub-pixel is a blue emission layer. The emission layer 332 disposed in the first sub-pixel SPX1, the emission layer 332 disposed in the second sub-pixel SPX2 and the emission layer 332 disposed in the third sub-pixel SPX3 can be separated from each other to be disposed. The emission layers 332 can be patterned and deposited in the respective emission areas EA using an open mask, e.g., a fine metal mask (FMM), for each sub-pixel SPX.

The emission layer 332 can further include various layers such as a hole transport layer, a hole injection layer, a hole blocking layer, an electron injection layer, an electron blocking layer and an electron transport layer. The emission layer 332 can be an organic emission layer formed of an organic material, but is not limited thereto. For example, the emission layer 332 can also be formed of a quantum dot emission layer or micro LEDs.

The second electrode 333 can be disposed on the entire surface of the substrate 110 including the emission layers 332 patterned in the respective emission areas EA.

Hereinafter, a method of fabricating a light emitting display device of the present disclosure will be described in detail according to another exemplary embodiment of the present disclosure.

FIG. 10A through FIG. 10G are cross-sectional views sequentially illustrating a method of fabricating a light emitting display device according to another exemplary embodiment of the present disclosure.

Figure 10A:
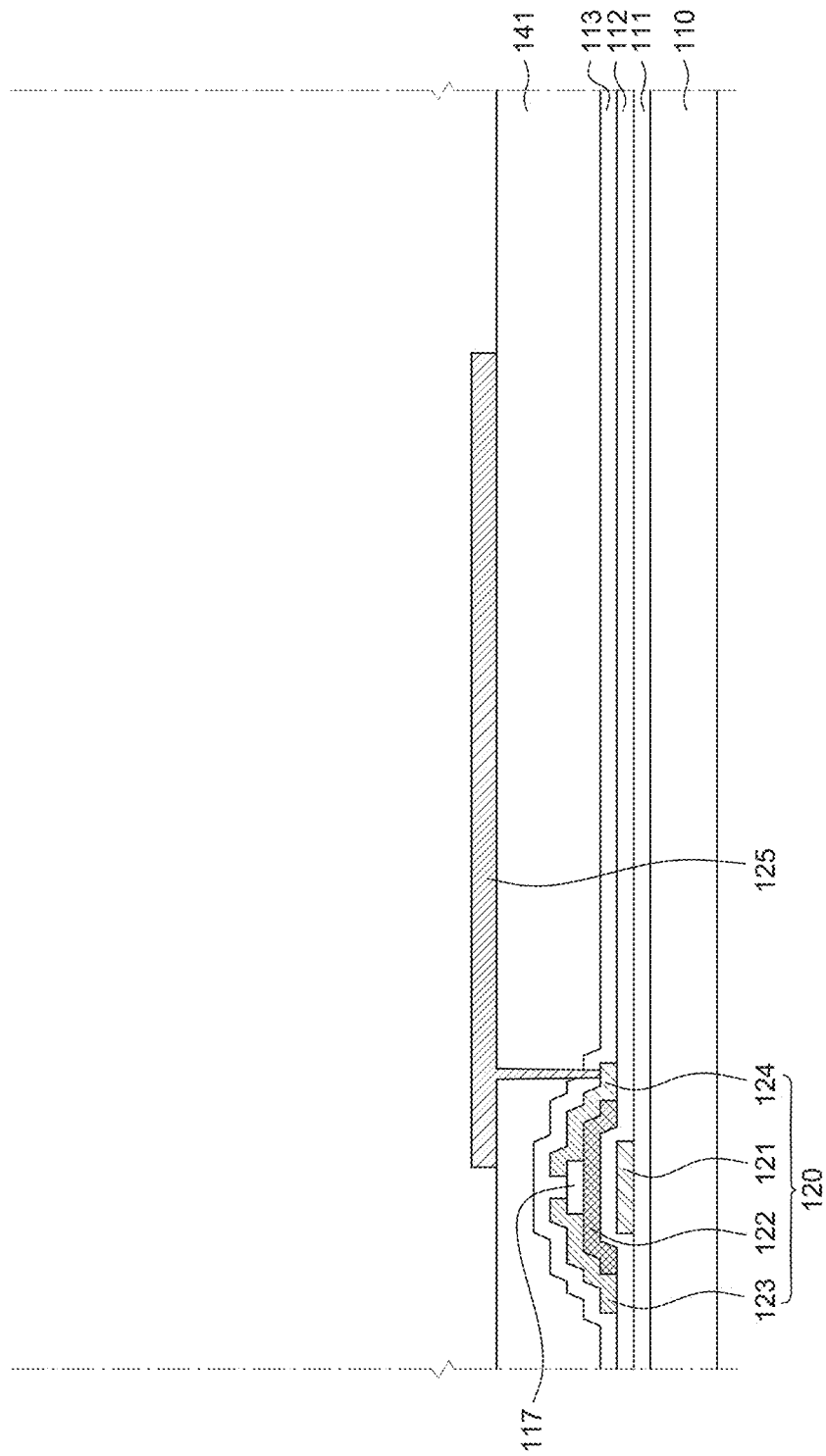
FIG. 10A through FIG. 10G are cross-sectional views sequentially illustrating a method of fabricating a light emitting display device according to another exemplary embodiment of the present disclosure.

Referring to FIG. 10A, the buffer layer 111 is formed on the substrate 110 and a first metal layer is laminated on the buffer layer 111, followed by patterning.

The substrate 110 serves to support and protect various components of the light emitting display device 300.

The substrate 110 can be formed of glass or a plastic material having flexibility. If the substrate 110 is formed of plastic material, it can be formed of, e.g., polyimide (PI), but is not limited thereto.

The buffer layer 111 functions to enhance adhesion between the substrate 110 and layers formed on the buffer layer 111 and block alkali elements discharged from the substrate 110.

The buffer layer 111 can be formed as a single layer of silicon nitride (SiNx) or silicon oxide (SiOx) or a multilayer of silicon nitride (SiNx) and/or silicon oxide (SiOx), but is not limited thereto. The buffer layer 111 can be omitted depending on the kind and material of the substrate 110 and a structure and type of the thin film transistor 120.

The first metal layer can be formed of any one of various metal materials such as molybdenum (Mo), aluminum (Al), chromium (Cr), gold (Au), titanium (Ti), nickel (Ni), neodymium (Nd), and copper (Cu) or an alloy of two or more of them, or a multilayer thereof, but is not limited thereto.

Then, the gate electrode 121 of the thin film transistor is formed by patterning the first metal layer.

A photoresist can be coated on the first metal layer and the first metal layer can be patterned through a photolithographic process using a photomask to form the above-described gate electrode 121. A photolithographic mask process can be performed through a series of processes such as developing, etching, and stripping or asking after exposure by means of an exposure device using a photomask.

Then, the gate insulating layer 112 is formed on the substrate 110 and a semiconductor layer is formed thereon, followed by patterning to form the active layer 122 of the thin film transistor.

The gate insulating layer 112 is an insulating layer serving to electrically insulate the gate electrode 121 from the active layer 122. The gate insulating layer 112 can be formed of an insulating material. For example, the gate insulating layer 112 can be formed as a single layer of silicon nitride (SiNx) or silicon oxide (SiOx) or a multilayer of silicon nitride (SiNx) and/or silicon oxide (SiOx), but is not limited thereto.

The active layer 122 can be disposed so as to overlap the gate electrode 121.

For example, the active layer 122 can be formed of an oxide semiconductor, amorphous silicon (a-Si), polycrystalline silicon (poly-Si), or an organic semiconductor.

Then, the etch stopper 117 can be formed on the active layer 122.

The etch stopper 117 can be formed to suppress damage to a back channel surface of the active layer 122 by plasma when the source electrode 123 and the drain electrode 124 are patterned and formed by etching.

One end of the etch stopper 117 can overlap the source electrode 123 and the other end thereof can overlap the drain electrode 124. The etch stopper 117 can also be omitted.

Then, a second metal layer is formed on the substrate 110 on which the etch stopper 117 has been formed, and the second metal layer is patterned to form the source electrode 123 and the drain electrode 124.

The second metal layer can be formed of any one of various metal materials such as molybdenum (Mo), aluminum (Al), chromium (Cr), gold (Au), titanium (Ti), nickel (Ni), neodymium (Nd), and copper (Cu) or an alloy of two or more of them, or a multilayer thereof, but is not limited thereto.

Then, the passivation layer 113 can be formed on the substrate 110.

The passivation layer 113 can serve to protect the thin film transistor 120. The passivation layer 113 can be formed as a single layer of silicon nitride (SiNx) or silicon oxide (SiOx) or a multilayer of silicon nitride (SiNx) and/or silicon oxide (SiOx), but is not limited thereto. The passivation layer 113 can also be omitted.

Then, the first overcoating layer 141 can be formed on the passivation layer 113. The first overcoating layer 141 is an insulating layer serving to protect the thin film transistor 120 and reduce a step difference between layers disposed on the substrate 110. The first overcoating layer 141 can be formed of any one of acrylic-based resin, epoxy resin, phenol resin, polyamide-based resin, polyimide-based resin, unsaturated polyester-based resin, polyphenylene-based resin, benzocyclobutene, photoresist and poly(phenylenesulfide)-based resin, but is not limited thereto.

The first overcoating layer 141 can be disposed on the thin film transistor 120. A top surface of the first overcoating layer 141 can be parallel with the substrate 110. Thus, the first overcoating layer 141 can planarize a step difference which can be caused by components disposed under the first overcoating layer 141.

Then, a third metal layer is formed on the first overcoating layer 141, and the third metal layer is patterned to form the connection electrode 125.

The connection electrode 125 can be electrically connected with the drain electrode 124 through a contact hole formed in the first overcoating layer 141 and the passivation layer 113, but is not limited thereto. The connection electrode 125 can also be electrically connected with the source electrode 123 through the contact hole formed in the first overcoating layer 141 and the passivation layer 113.

The third metal layer can be formed of any one of various metal materials such as molybdenum (Mo), aluminum (Al), chromium (Cr), gold (Au), titanium (Ti), nickel (Ni), neodymium (Nd), and copper (Cu) or an alloy of two or more of them, or a multilayer thereof, but is not limited thereto.

Figure 10B:
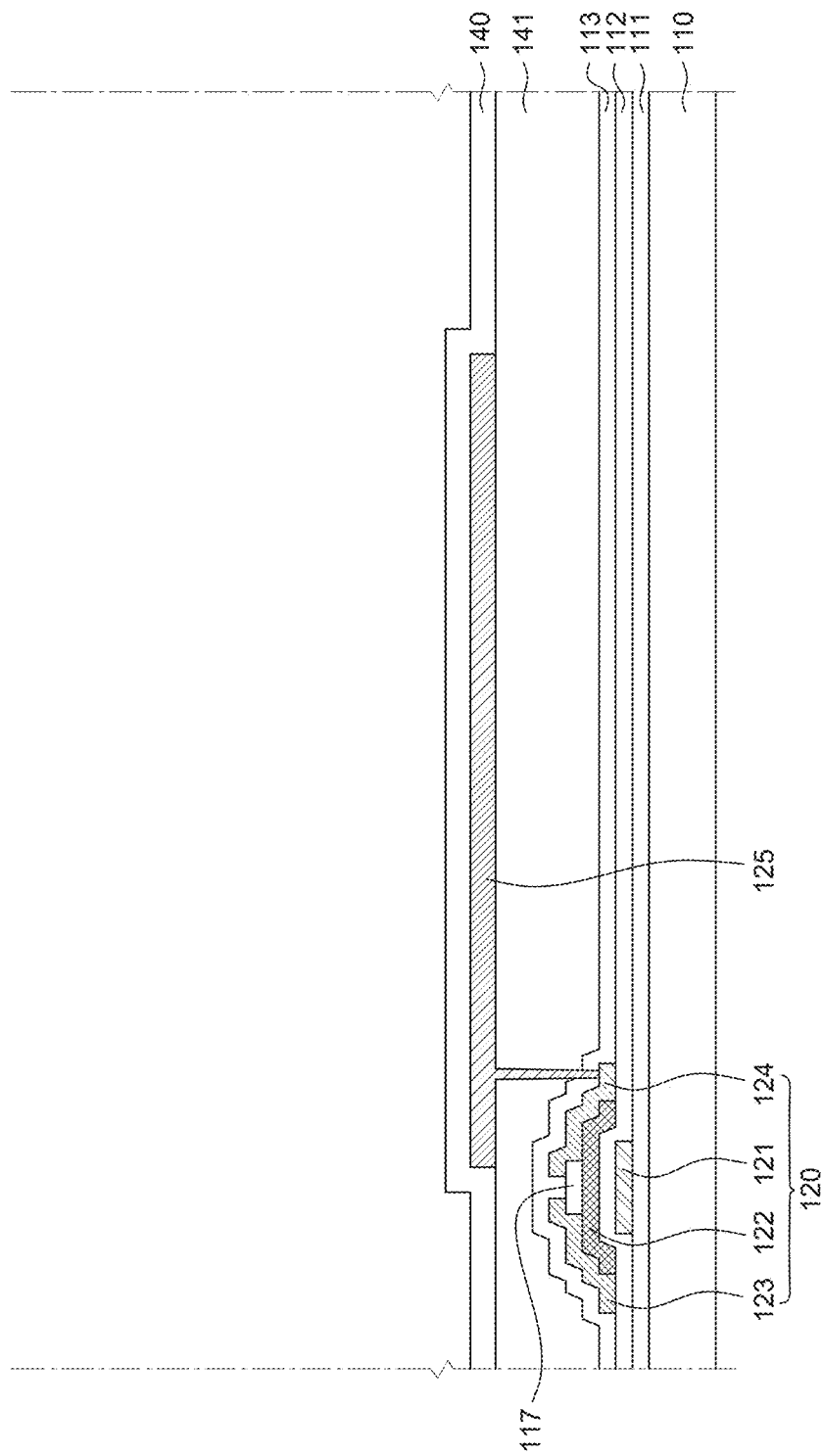

Then, referring to FIG. 10B, an insulating layer 140 is deposited on the entire surface of the substrate 110 on which the connection electrode 125 and the first overcoating layer 141 have been formed.

The insulating layer 140 can be formed to a greater thickness than the first electrode 231 to form an undercut structure at an edge of the first electrode 231. For example, if the thickness of the first electrode 231 is set to 92.3% or less of that of the insulating layer 140, an undercut structure of the present disclosure can be formed.

The insulating layer 140 can be formed as a single layer of silicon nitride (SiNx) or silicon oxide (SiOx) or a multilayer of silicon nitride (SiNx) and/or silicon oxide (SiOx), but is not limited thereto. For example, the insulating layer 140 can be formed as a double layer of silicon nitride (SiNx) and silicon oxide (SiOx) to a thickness of 1300 Å to 2500 Å.

Figure 10C:
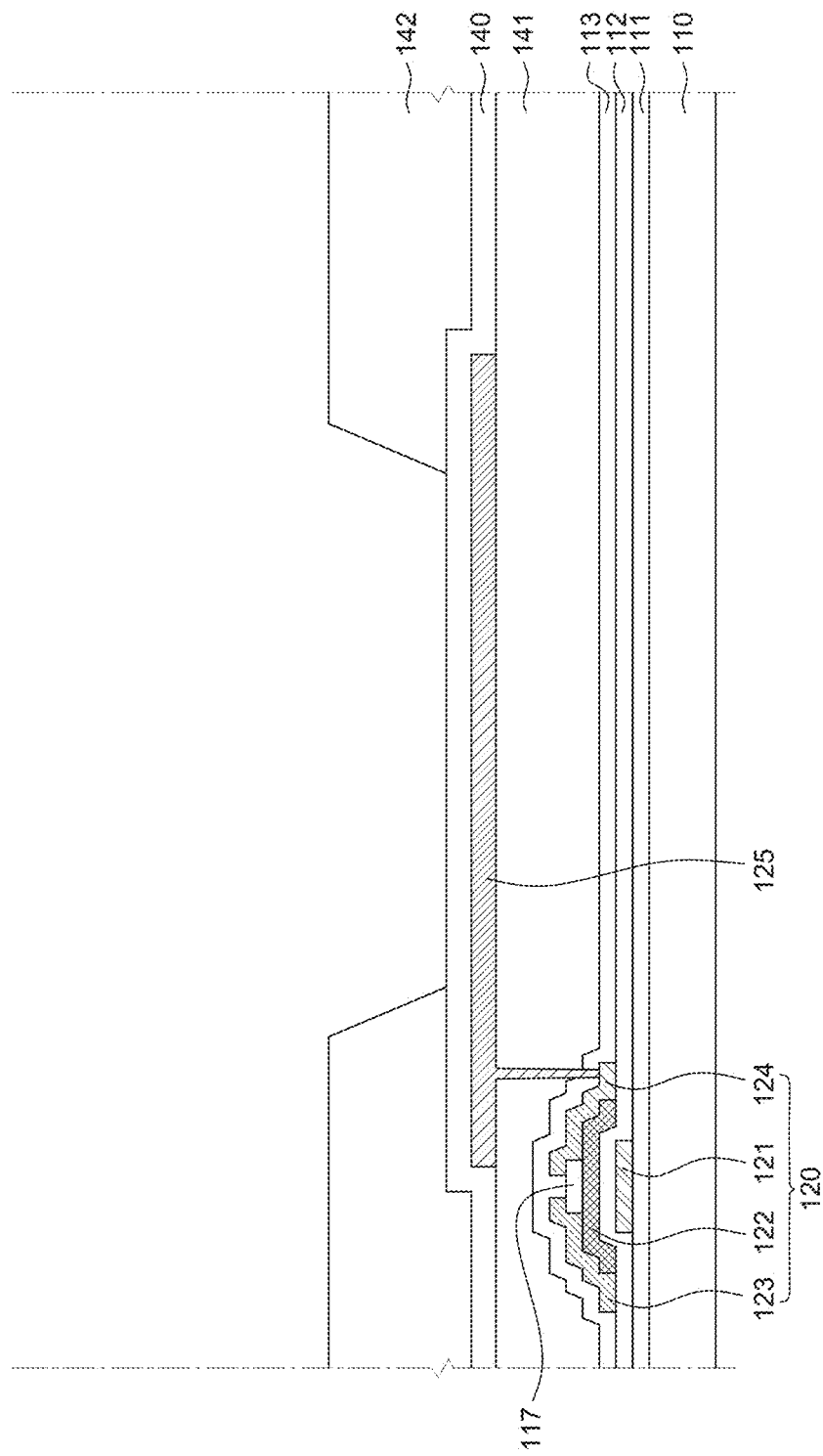

Then, referring to FIG. 10C, an organic insulating layer is formed on the insulating layer 140, and the organic insulating layer is patterned to form the second overcoating layer 142. Dry etching can be performed to pattern the organic insulating layer.

The second overcoating layer 142 can also be formed of the same material as the first overcoating layer 141.

For example, the second overcoating layer 142 can be formed of any one of acrylic-based resin, epoxy resin, phenol resin, polyamide-based resin, polyimide-based resin, unsaturated polyester-based resin, polyphenylene-based resin, benzocyclobutene, photoresist and poly(phenylenesulfide)-based resin, but is not limited thereto.

A side surface of the second overcoating layer 142 can have a taper having a predetermined angle. For example, the side surface of the second overcoating layer 142 can be tapered at an angle of 30° to 60°, but is not limited thereto.

The second overcoating layer 142 can include a top surface and a side surface.

The top surface of the second overcoating layer 142 is located at the uppermost portion of the second overcoating layer 142 and can be substantially parallel with the substrate 110.

The side surface of the second overcoating layer 142 can be a surface extended from the top surface to the side surface of the second overcoating layer 142.

Figure 10D:
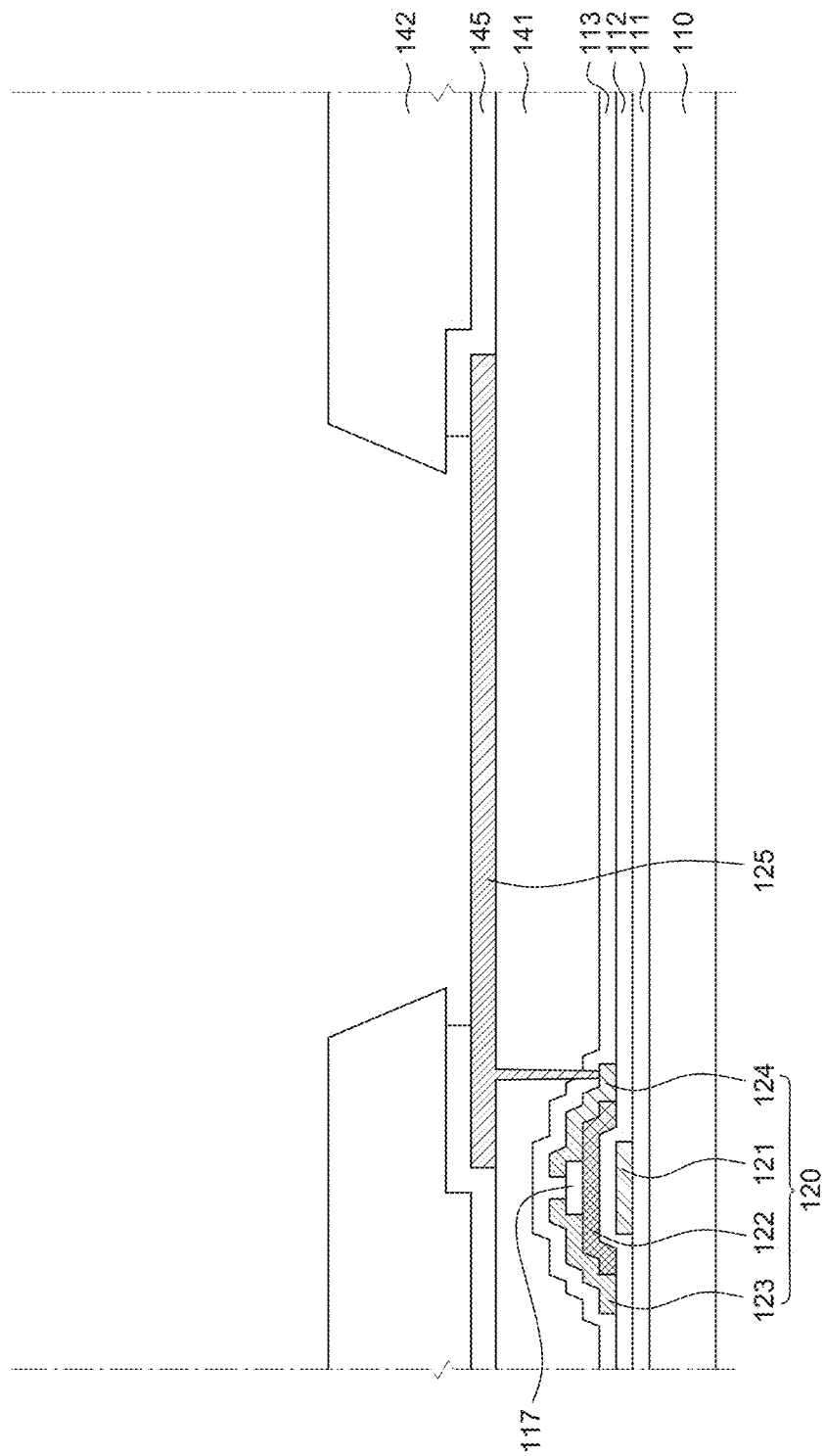

Then, referring to FIG. 10D, the insulating layer 140 can be additionally etched using the second overcoating layer 142 as a mask. Wet etching can be performed to etch the insulating layer 140.

The second overcoating layer 142 can have an undercut structure at a bottom portion of the side surface by additionally etching the insulating layer 140 from the side surface to the inside of the second overcoating layer 142 in a horizontal direction to form a sacrificial layer 145.

An etch bias which is the distance from the end of the side surface of the second overcoating layer 142 to the end of the sacrificial layer 145 varies depending on process conditions and can be in the range of 0.8 μm to 1.3 μm.

Figure 10E:
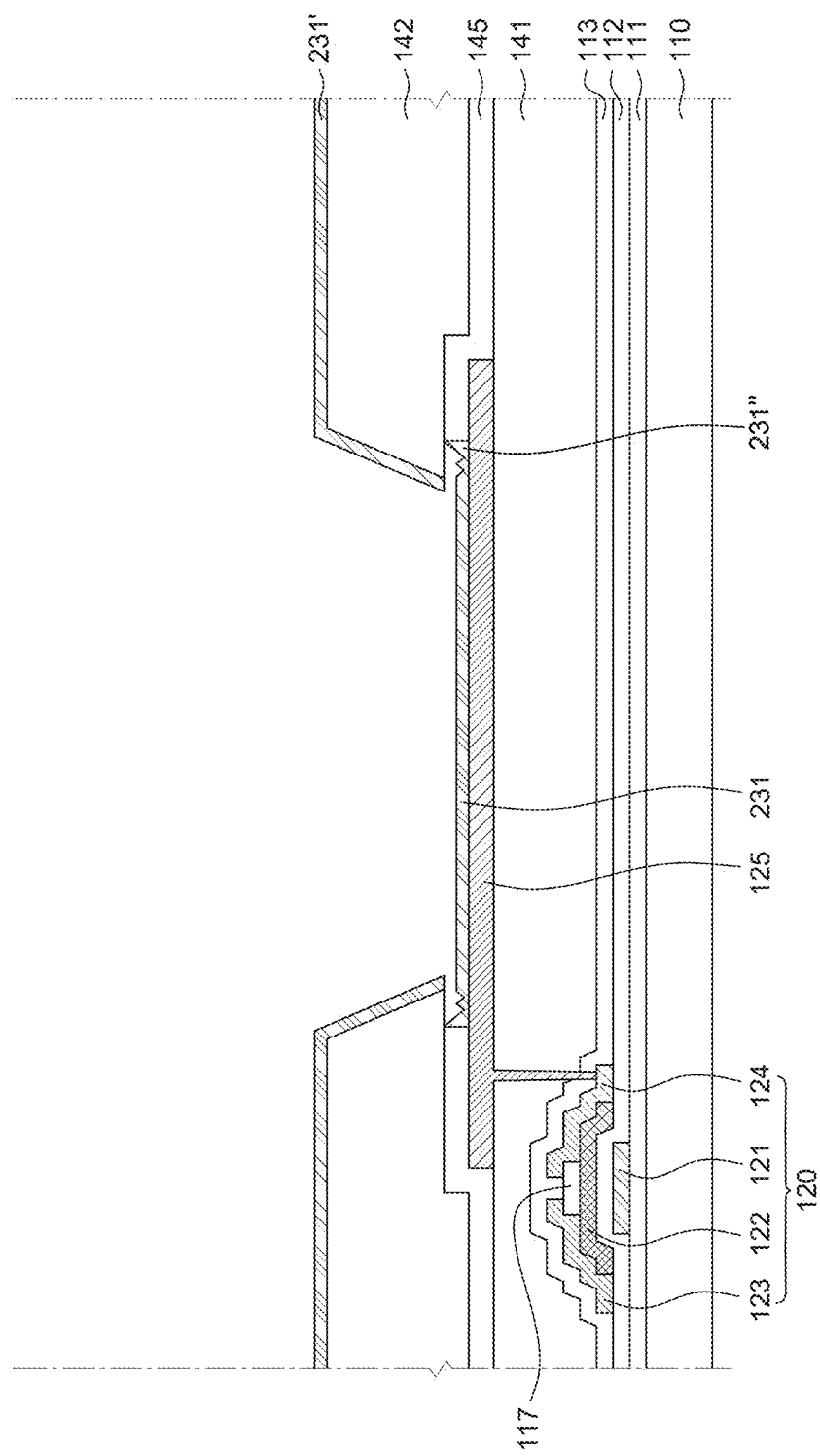

Then, referring to FIG. 10E, a fourth metal layer and a fifth metal layer are deposited on the entire surface of the substrate 110 to form the first electrode 231 on the connection electrode 125.

The first electrode 231 can be disposed on the surface of the connection electrode 125 which is not covered by the sacrificial layer 145 and whose surface is exposed. The first electrode 231 can also be disposed inside the undercut structure at the bottom portion of the side surface of the second overcoating layer 142 so as to be in contact with a side surface of the sacrificial layer 145.

The dummy first electrode 231' can be formed on the top surface and the side surface of the second overcoating layer 142 when the first electrode 231 is formed. The dummy first electrode 231' can be deposited on the top surface and the side surface of the second overcoating layer 142 when the first electrode 231 is deposited. Also, the dummy first electrode 231' can be separated from the first electrode 231 by the undercut structure of the second overcoating layer 142.

The dummy first electrode 231' disposed on the side surface of the second overcoating layer 142 can be tapered at an angle of 30° to 60°, but is not limited thereto.

The light emitting display device 200 according to another exemplary embodiment of the present disclosure is a top emission type light emitting display device. Therefore, the reflective layer of the dummy first electrode 231' can reflect light emitted from the light emitting element 230 in an upward direction. Light generated from the emission layer 232 of the light emitting element 230 is emitted not only in the upward direction but also in a side direction. The light emitted in the side direction can travel to the inside of the light emitting display device 200 and can be confined inside the light emitting display device 200 by total reflection. Further, the light can disappear while traveling to the inside of the light emitting display device 200. Thus, the reflective layer of the dummy first electrode 231' can be disposed covering the side surface of the second overcoating layer 142. Therefore, a traveling direction of light can be changed from the side direction to the upward direction.

The first electrode 231 and the dummy first electrode 231' can be formed by deposition without performing a mask process.

Contrary to the sacrificial layer 145, the first electrode 231 can be formed to have an inverse taper at an edge thereof.

The thickness of the first electrode 231 can be set to 92.3% or less of that of the sacrificial layer 145 to separate the first electrode 231 from the dummy first electrode 231'.

A part of the surface of the first electrode 231 can be substantially flat, but a part of the edge of the first electrode 231 can have the uneven structure 231". If a part of the edges of the first electrode 231 is not flat and has the uneven structure 231", a wave guide and an SP mode can be extracted. Thus, it is possible to contribute to an efficiency enhancement at the top surface.

A reflective layer and a transparent conductive layer disposed on the reflective layer can be included in each of the first electrode 231 and the dummy first electrode 231'. However, the present disclosure is not limited thereto. Each of the first electrode 231 and the dummy first electrode 231' can have a three-layer structure including a transparent conductive layer, a reflective layer and a transparent conductive layer.

The reflective layer can be disposed on the connection electrode 125. The light emitting display device 200 according to another exemplary embodiment of the present disclosure is a top emission type light emitting display device. Therefore, the reflective layer can reflect light emitted from the light emitting element 230 in an upward direction.

The reflective layer as the fourth metal layer can be formed of a metal material such as aluminum (Al), silver (Ag), copper (Cu), a magnesium-silver alloy, or the like, but is not limited thereto.

The reflective layer can be electrically connected with the drain electrode 124 through the connection electrode 125, but is not limited thereto. The reflective layer can also be electrically connected with the source electrode 123 through the connection electrode 125.

The transparent conductive layer as the fifth metal layer can be disposed on the reflective layer. The transparent conductive layer can be disposed on the reflective layer and electrically connected with the drain electrode through the reflective layer and the connection electrode 125. The transparent conductive layer can be formed of a conductive material having a high work function to supply holes to the emission layer 232.

For example, the transparent conductive layer can be formed of a transparent conductive oxide such as indium tin oxide (ITO), indium zinc oxide (IZO), indium tin zinc oxide (ITZO), zinc oxide (ZnO) and tin oxide (TO), but is not limited thereto.

Figure 10F:
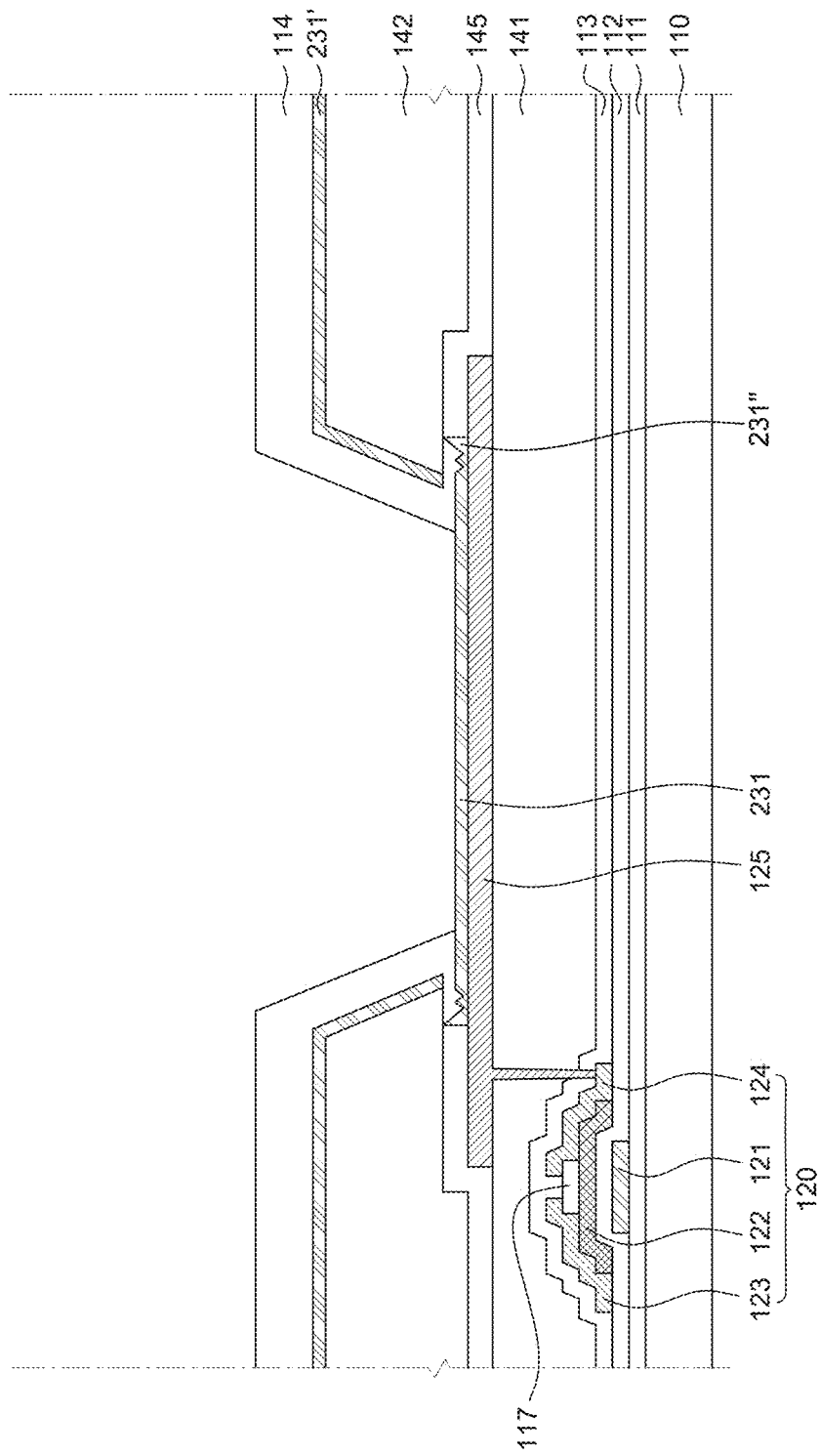

Then, referring to FIG. 10F, the bank layer 114 can be formed on the second overcoating layer 142.

The bank layer 114 can be disposed on the second overcoating layer 142 so as to cover the entire dummy first electrode 231' and a part of an edge of the first electrode 231. The bank layer 114 can fill the inside of the undercut structure at the bottom end of the side surface of the second overcoating layer 142. Thus, the bank layer 114 can be interposed between the first electrode 231 and the dummy first electrode 231'.

The bank layer 114 can cover a part of an edge of the first electrode 231 throughout a plurality of sub-pixels SPX to define the emission area EA and the non-emission area NEA. For example, in the non-emission area NEA, the bank layer 114 is disposed on the first electrode 231 to block the generation of light from the non-emission area NEA. Meanwhile, in the emission area EA, the bank layer 114 is not disposed, but the emission layer 232 is located right on the first electrode 231. Thus, light can be generated from the emission layer 232.

The bank layer 114 can be formed of an organic material or an inorganic material.

For example, the bank layer 114 can be formed of an organic material such as polyimide, acryl or benzocyclobutene, or an inorganic material such as silicon nitride (SiNx) or silicon oxide (SiOx), but is not limited thereto.

Figure 10G:
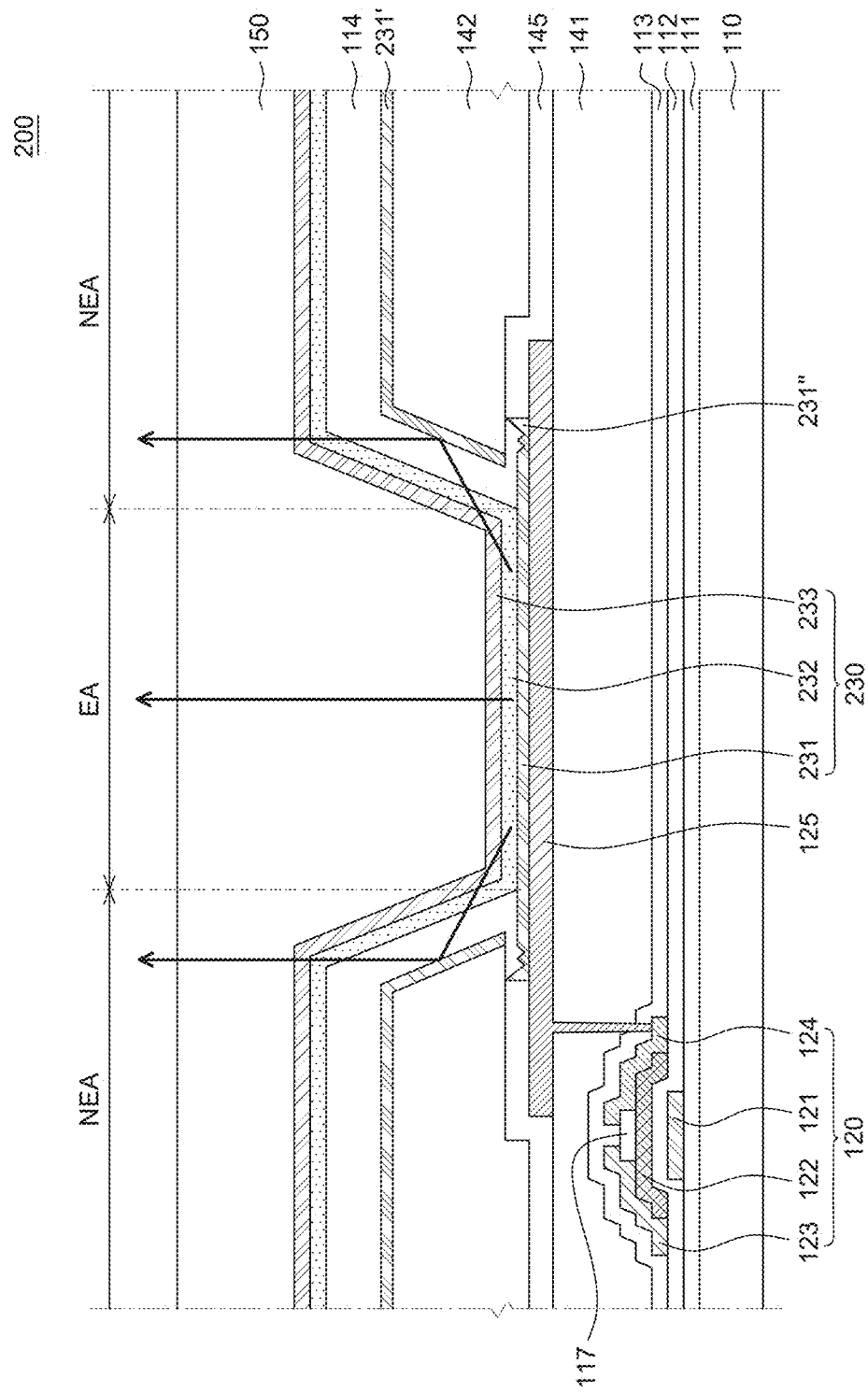

Then, referring to FIG. 10G, the emission layer 232 and the second electrode 233 can be formed on the bank layer 114. The emission layer 232 and the second electrode 233 can form the light emitting element 230 together with the first electrode 231.

The emission layer 232 can be disposed to be in contact with the first electrode 231 throughout a plurality of sub-pixels SPX. For example, the emission layer 232 can be disposed on the first electrode 231 throughout the entire surface of the substrate 110, but is not limited thereto. The emission layer 232 can be disposed on the first electrode 231 only in the emission area EA. In this case, the emission layer 232 can be disposed to be surrounded by the bank layer 114.

The second electrode 233 can be disposed on the emission layer 232 in a sub-pixel SPX. For example, the second electrode 233 is disposed in contact with the emission layer 232 along the shape of the emission layer 232 in the emission area EA and the non-emission area NEA, but is not limited thereto.

The second electrode 233 can supply electrons to the emission layer 232. The second electrode 233 can be formed of a metal material such as silver (Ag), copper (Cu), a magnesium-silver alloy, or the like, but is not limited thereto. If the second electrode 233 is formed of a metal material, it has a very low refractive index. For example, if the second electrode 233 is formed of silver (Ag), the second electrode 233 can have a refractive index of about 0.13.

Then, the encapsulation layer 150 can be formed on the second electrode 233.

The encapsulation layer 150 can block the permeation of oxygen and moisture into the light emitting display device 200 from the outside.

A first encapsulation layer, a second encapsulation layer and a third encapsulation layer can be include in the encapsulation layer 150.

The first encapsulation layer can be disposed on the second electrode 233 to suppress the permeation of moisture or oxygen.

Herein, the first encapsulation layer can be formed of an inorganic material such as silicon nitride (SiNx), silicon oxynitride (SiOxNy) or aluminum oxide (AlyOz), but is not limited thereto. The first encapsulation layer can be formed of a material having a higher refractive index than the second encapsulation layer. For example, if the first encapsulation layer is formed of silicon nitride (SiNx) or silicon oxynitride (SiOxNy), the refractive index of the first encapsulation layer can be about 1.8.

The second encapsulation layer can be disposed on the first encapsulation layer to planarize the surface of the first encapsulation layer. Further, the second encapsulation layer can cover foreign materials or particles which can be produced during a fabricating process. The second encapsulation layer can be formed of an organic material such as silicon oxycarbide (SiOxCz) or acryl-based or epoxy-based resin, but is not limited thereto. The second encapsulation layer can be formed of a material having a lower refractive index than the first encapsulation layer. For example, if the second encapsulation layer is formed of acryl-based resin, the refractive index of the second encapsulation layer can be from about 1.5 to about 1.6.

The third encapsulation layer can be disposed on the second encapsulation layer and can suppress the permeation of moisture or oxygen like the first encapsulation layer.

For example, the third encapsulation layer can be formed of an inorganic material such as silicon nitride (SiNx), silicon oxynitride (SiOxNy), silicon oxide (SiOx) or aluminum oxide (AlyOz), but is not limited thereto. The third encapsulation layer can be formed of the same material as the first encapsulation layer or can be formed of a different material from the first encapsulation layer.

Meanwhile, a light emitting display device of the present disclosure can also be applied to a case where a touch unit is added on an encapsulation layer. This will be described in detail with reference to still another exemplary embodiment of the present disclosure.

Figure 11:
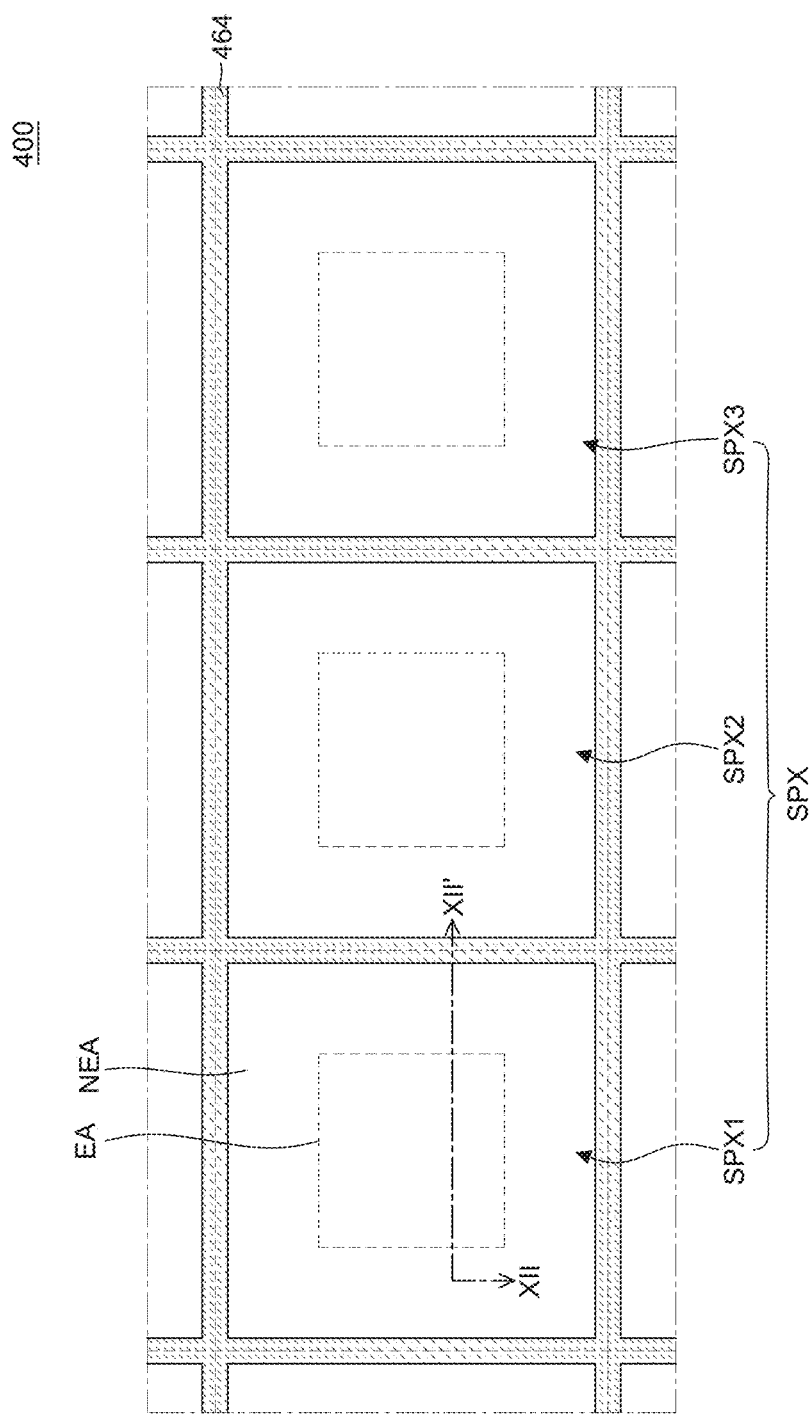
FIG. 11 is a plan view of a light emitting display device according to still another exemplary embodiment of the present disclosure.

FIG. 11 is a plan view of a light emitting display device according to still another exemplary embodiment of the present disclosure.

Figure 12:
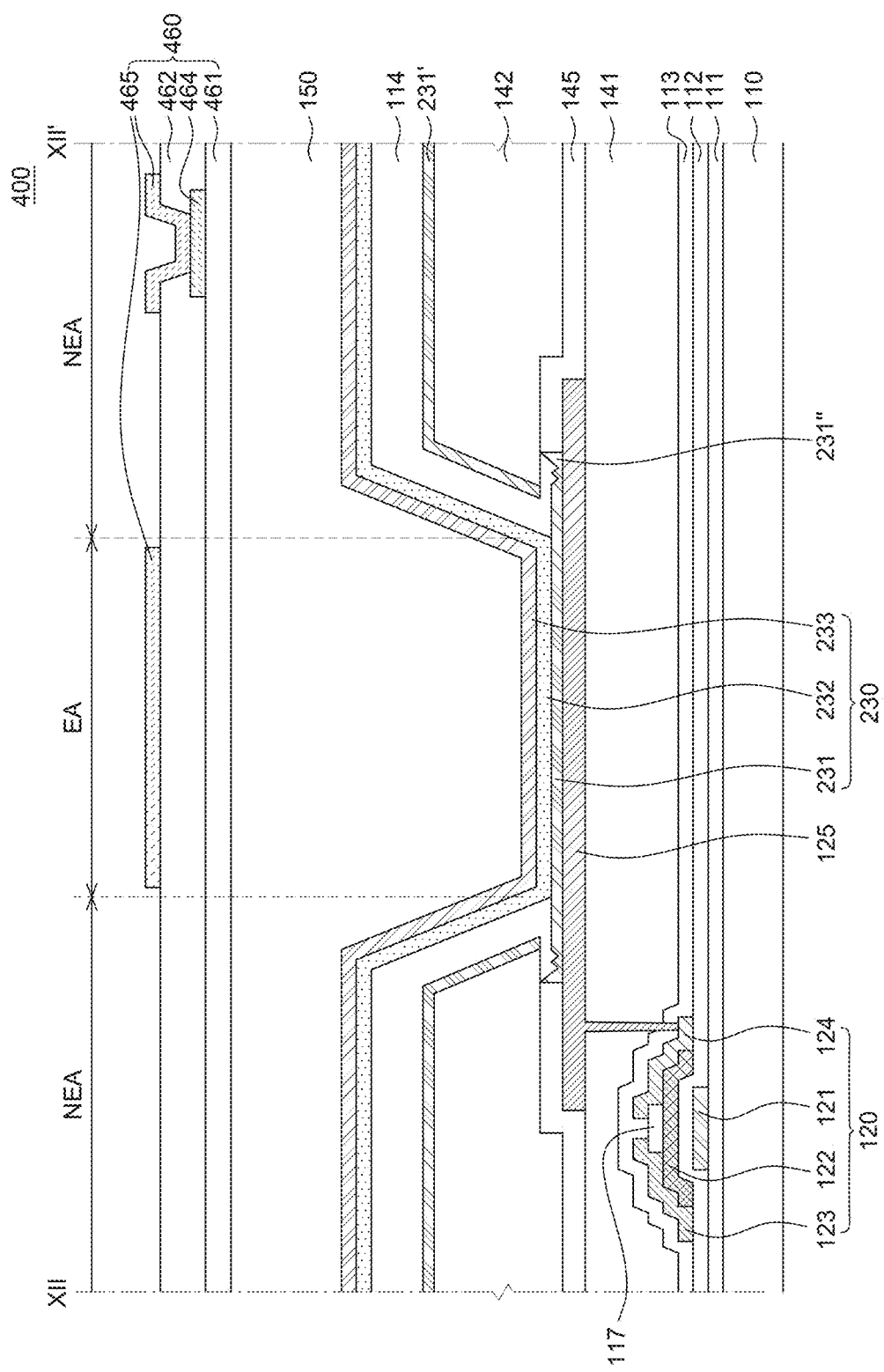
FIG. 12 is a cross-sectional view of the light emitting display device as taken along a line XII-XII' of FIG. 11.

FIG. 12 is a cross-sectional view of the light emitting display device as taken along a line XII-XII' of FIG. 11.

A light emitting display device 400 illustrated in FIG. 11 and FIG. 12 is substantially the same as the light emitting display device 200 illustrated in FIG. 4 except a touch unit 460. Thus, the redundant description thereof will be omitted or will be brief. FIG. 11 illustrates only a plurality of sub-pixels SPX and touch lines 464 for convenience in explanation.

Referring to FIG. 11 and FIG. 12, the touch unit 460 can be disposed on the encapsulation layer 150. The touch unit 460 can be disposed in the active area A/A including the light emitting element 230 to sense a touch input. The touch unit 460 can sense external touch information provided by a finger of a user or a touch pen. The touch unit 460 can include a first inorganic insulating layer 461, a second inorganic insulating layer 462, a touch line 464 and a touch electrode 465.

The first inorganic insulating layer 461 is disposed on the encapsulation layer 150.

The first inorganic insulating layer 461 can be disposed on and in contact with the third encapsulation layer of the encapsulation layer 150. The first inorganic insulating layer 461 can be formed of an inorganic material. For example, the first inorganic insulating layer 461 can be formed of an inorganic material such as silicon nitride (SiNx) or silicon oxynitride (SiOxNy). For example, if the first inorganic insulating layer 461 is formed of silicon nitride (SiNx), the refractive index of the first inorganic insulating layer 461 can be about 1.8.

The touch line 464 can be disposed on the first inorganic insulating layer 461.

The touch line 464 can be disposed on the first inorganic insulating layer 461 in the non-emission area NEA. The touch line 464 can be disposed in a row direction or in a column direction. The touch line 464 supplies a touch driving signal for driving the touch unit 460. Further, the touch line 464 can transmit the touch information sensed by the touch unit 460 to a driving IC.

The second inorganic insulating layer 462 can be disposed on the touch line 464 and the first inorganic insulating layer 461. The second inorganic insulating layer 462 can be disposed on the first inorganic insulating layer 461 and the touch line 464 to planarize a top surface thereof.

The second inorganic insulating layer 462 serves to suppress a short circuit of the touch line 464 disposed adjacent thereto. The second inorganic insulating layer 462 can be formed of the same material as the first inorganic insulating layer 461. For example, the second inorganic insulating layer 462 can be formed of an inorganic material such as silicon nitride (SiNx) or silicon oxynitride (SiOxNy). For example, if the second inorganic insulating layer 462 is formed of silicon nitride (SiNx), the refractive index of the second inorganic insulating layer 462 can be about 1.8. If the second inorganic insulating layer 462 has the same refractive index as the first inorganic insulating layer 461, a material of the second inorganic insulating layer 462 is not limited thereto.

The touch electrode 465 can be disposed on the touch line 464 and the second inorganic insulating layer 462.

The touch electrode 465 can be disposed in a row direction or in a column direction. For example, the touch electrode 465 disposed in any one of the row direction and the column direction can be disposed on the touch line 464. Also, the touch electrode 465 disposed in the other one of the row direction and the column direction can be disposed on the second inorganic insulating layer 462. The touch electrode 465 disposed in the column direction and the touch electrode 465 disposed in the row direction can be connected with each other through a bridge electrode to form a mesh structure. FIG. 12 illustrates that the touch electrode 465 is disposed in the emission area EA. However, the touch electrode 465 may not be disposed in the emission area EA, but is not limited thereto.

The exemplary embodiments of the present disclosure can also be described as follows:

According to an aspect of the present disclosure, a light emitting display device includes a substrate defined by a plurality of sub-pixels and a first overcoating layer disposed on the substrate. The light emitting display device also includes a connection electrode and a sacrificial layer disposed on the first overcoating layer and a first electrode disposed on the connection electrode. The light emitting display device further includes a second overcoating layer disposed on the sacrificial layer and including an opening that exposes a portion of the first electrode. The light emitting display device also includes a dummy first electrode disposed on a top surface of the second overcoating layer and a side surface of the opening and separated from the first electrode. The light emitting display device further includes a bank layer covering the dummy first electrode and a portion of the first electrode, and an emission layer and a second electrode disposed on the first electrode and the bank layer.

The connection electrode can be electrically connected with a drain electrode of a thin film transistor.

The second overcoating layer can have an undercut structure at a bottom end of a side surface by removing the sacrificial layer from the side surface to inside of the second overcoating layer.

The first electrode can be also disposed inside the undercut structure.

The first electrode inside the undercut structure can have an uneven structure on a surface.

The second overcoating layer can expose the entire surface of the first electrode except the uneven structure of the first electrode.

The side surface of the second overcoating layer where the first electrode is exposed is tapered at an angle of 30° to 60°.

The bank layer fills inside of the undercut structure.

A distance from an end of the side surface of the second overcoating layer to an end of the sacrificial layer can be in a range of 0.8 μm to 1.3 μm.

A thickness of the first electrode can be 92.3% or less of that of the sacrificial layer.

The sacrificial layer can have a positive taper at an edge thereof, and the sacrificial layer can be disposed on the first overcoating layer so as to cover an edge of the connection electrode.

The first electrode can be disposed in contact with a side surface of the sacrificial layer and on the connection electrode which can be not covered by the sacrificial layer and whose surface is exposed.

The bank layer can be disposed on the second overcoating layer so as to cover the entire dummy first electrode and a part of an edge of the first electrode.

The emission layer can be disposed only on the first electrode inside the opening.

The light emitting display device can further comprise an encapsulation layer disposed on the second electrode; and a touch unit on the encapsulation layer.

The touch unit can include a first inorganic insulating layer on the encapsulation layer; a second inorganic insulating layer on the first inorganic insulating layer; and a touch line and a touch electrode disposed on the first inorganic insulating layer or the second inorganic insulating layer.

According to another aspect of the present disclosure, a method of fabricating a light emitting display device includes preparing a first overcoating layer on a substrate on which a thin film transistor has been provided. The method also includes preparing a connection electrode on the first overcoating layer and preparing an insulating layer on the entire surface of the substrate on which the connection electrode and the first overcoating layer have been provided. The method further includes preparing a second overcoating layer including an opening on the insulating layer. The method also includes making an undercut structure at a bottom portion of a side surface of the second overcoating layer by etching the insulating layer using the second overcoating layer as a mask. The method further includes preparing a first electrode on the connection electrode as well as inside the undercut structure and preparing a dummy first electrode on a top surface and a side surface of the second overcoating layer at the same time. The method also includes preparing a bank layer that covers the dummy first electrode and a portion of the first electrode and preparing an emission layer and a second electrode on the first electrode and the bank layer. The first electrode can be separated from the dummy first electrode by the undercut structure.

The first electrode and the dummy first electrode are prepared by deposition without performing a mask process.

The first electrode inside the undercut structure can have an uneven structure on a surface.

A thickness of the first electrode can be 92.3% or less of that of the insulating layer.

The undercut structure can be made at the bottom portion of the side surface of the second overcoating layer by removing the insulating layer from the side surface to inside of the second overcoating layer through wet etching using the second overcoating layer as a mask.

Although the exemplary embodiments of the present disclosure have been described in detail with reference to the accompanying drawings, the present disclosure is not limited thereto and can be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A light emitting display device, comprising:
   a substrate defined by a plurality of sub-pixels;
   a first overcoating layer disposed on the substrate;
   a connection electrode and a sacrificial layer disposed on the first overcoating layer;
   a first electrode disposed on the connection electrode;
   a second overcoating layer disposed on the sacrificial layer and including an opening that exposes a portion of the first electrode;
   a dummy first electrode disposed on a top surface of the second overcoating layer and a side surface of the opening of the second overcoating layer, and separated from the first electrode;
   a bank layer covering the dummy first electrode and a portion of the first electrode; and
   an emission layer and a second electrode disposed on the first electrode and the bank layer,
   wherein the connection electrode is disposed in an emission area, and
   wherein the first electrode is disposed on a portion of the connecting electrode.

2. The light emitting display device according to claim 1, wherein the connection electrode is electrically connected with a drain electrode of a thin film transistor.

3. The light emitting display device according to claim 1, wherein the second overcoating layer has an undercut structure at a bottom end of a side surface of the second overcoating layer by removing the sacrificial layer from the side surface of the second overcoating layer to inside of the second overcoating layer.

4. The light emitting display device according to claim 3, wherein the first electrode is also disposed inside the undercut structure of the second overcoating layer.

5. The light emitting display device according to claim 4, wherein the first electrode inside the undercut structure has an uneven structure on a surface of the first electrode.

6. The light emitting display device according to claim 5, wherein the second overcoating layer exposes an entire surface of the first electrode, except for the uneven structure of the first electrode.

7. The light emitting display device according to claim 5, wherein the side surface of the second overcoating layer where the first electrode is exposed is tapered at an angle of approximately 30° to 60°.

8. The light emitting display device according to claim 3, wherein the bank layer fills inside of the undercut structure of the second overcoating layer.

9. The light emitting display device according to claim 1, wherein a distance from an end of the side surface of the second overcoating layer to an end of the sacrificial layer is in a range of approximately 0.8 μm to 1.3 μm.

10. The light emitting display device according to claim 1, wherein a thickness of the first electrode is approximately 92.3% or less of a thickness of the sacrificial layer.

11. The light emitting display device according to claim 1, wherein the sacrificial layer has a positive taper at an edge of the sacrificial layer, and
    the sacrificial layer is disposed on the first overcoating layer so as to cover an edge of the connection electrode.

12. The light emitting display device according to claim 11, wherein the first electrode is disposed in contact with a side surface of the sacrificial layer, and is disposed on the connection electrode which is not covered by the sacrificial layer and whose surface is exposed.

13. The light emitting display device according to claim 1, wherein the bank layer is disposed on the second overcoating layer so as to cover the entire dummy first electrode and a part of an edge of the first electrode.

14. The light emitting display device according to claim 1, wherein the emission layer is disposed only on the first electrode inside the opening of the second overcoating layer.

15. The light emitting display device according to claim 1, further comprising:
    an encapsulation layer disposed on the second electrode; and
    a touch unit on the encapsulation layer,
    wherein the touch unit includes:
      a first inorganic insulating layer on the encapsulation layer;
      a second inorganic insulating layer on the first inorganic insulating layer; and
      a touch line and a touch electrode disposed on the first inorganic insulating layer or the second inorganic insulating layer.

16. A method of fabricating a light emitting display device, the method comprising:
    forming a first overcoating layer on a substrate on which a thin film transistor has been provided;
    forming a connection electrode on the first overcoating layer in an emission area;
    forming an insulating layer on an entire surface of the substrate on which the connection electrode and the first overcoating layer have been provided;
    forming a second overcoating layer including an opening in the emission area on the insulating layer;
    making an undercut structure at a bottom portion of a side surface of the second overcoating layer by etching the insulating layer using the second overcoating layer as a mask;
    forming a first electrode on the connection electrode as well as inside the undercut structure, and forming a dummy first electrode on a top surface and a side surface of the second overcoating layer at a same time;
    forming a bank layer that covers the dummy first electrode and a portion of the first electrode; and
    forming an emission layer and a second electrode on the first electrode and the bank layer,
    wherein the first electrode is separated from the dummy first electrode by the undercut structure.

17. The method of fabricating the light emitting display device according to claim 16, wherein the first electrode and the dummy first electrode are prepared by deposition without performing a mask process.

18. The method of fabricating the light emitting display device according to claim 16, wherein the first electrode inside the undercut structure has an uneven structure on a surface of the first electrode.

19. The method of fabricating the light emitting display device according to claim 16, wherein a thickness of the first electrode is approximately 92.3% or less of a thickness of the insulating layer.

20. The method of fabricating the light emitting display device according to claim 16, wherein the undercut structure is made at the bottom portion of the side surface of the second overcoating layer by removing the insulating layer from the side surface to inside of the second overcoating layer through wet etching using the second overcoating layer as a mask.

* * * * *